(12) United States Patent
McAlister

(10) Patent No.: US 8,828,491 B2
(45) Date of Patent: Sep. 9, 2014

(54) METHODS FOR MANUFACTURING ARCHITECTURAL CONSTRUCTS

(75) Inventor: Roy Edward McAlister, Phoenix, AZ (US)

(73) Assignee: McAlister Technologies, LLC, Phoenix, AZ (US)

( * ) Notice: Subject to any disclaimer, the term of this patent is extended or adjusted under 35 U.S.C. 154(b) by 0 days.

(21) Appl. No.: 13/584,644

(22) Filed: Aug. 13, 2012

(65) Prior Publication Data

US 2013/0064979 A1 Mar. 14, 2013

Related U.S. Application Data

(60) Provisional application No. 61/526,185, filed on Aug. 22, 2011, provisional application No. 61/523,261, filed on Aug. 12, 2011.

(51) Int. Cl.
*C23C 16/00* (2006.01)
*C02F 1/28* (2006.01)

(52) U.S. Cl.
USPC ................................. 427/248.1; 427/255.23

(58) Field of Classification Search
None
See application file for complete search history.

(56) References Cited

U.S. PATENT DOCUMENTS

| | | | |
|---|---|---|---|
| 4,407,238 A | 10/1983 | Yoon | |
| 4,567,857 A | 2/1986 | Houseman et al. | |
| 4,600,529 A | 7/1986 | Hallen et al. | |
| 5,067,447 A | 11/1991 | Iwaki et al. | |
| 5,220,080 A | 6/1993 | Lyons et al. | |
| 5,269,953 A | 12/1993 | Whewell | |
| 5,407,245 A | 4/1995 | Geropp | |
| 6,015,041 A | 1/2000 | Heung | |
| 6,503,584 B1 | 1/2003 | McAlister | |
| 6,538,892 B2 | 3/2003 | Smalc | |
| 6,709,497 B2 | 3/2004 | Myasnikov et al. | |
| 6,854,788 B1 | 2/2005 | Graham | |
| 7,112,239 B2 | 9/2006 | Kimbara et al. | |
| 7,152,908 B2 | 12/2006 | Shahbazi | |
| 7,172,645 B1 | 2/2007 | Pfister et al. | |
| 7,210,467 B2 | 5/2007 | Kweon et al. | |
| 7,306,862 B2 | 12/2007 | Kramer et al. | |
| 7,320,726 B2 | 1/2008 | Shih et al. | |

(Continued)

FOREIGN PATENT DOCUMENTS

| | | |
|---|---|---|
| JP | 0940491 | 2/1997 |
| JP | 2002158175 A | 5/2002 |
| WO | WO01-13032 A1 | 2/2001 |

OTHER PUBLICATIONS

Motonobu, JP2002-158175, May 2002, Eng machine translation.*

(Continued)

*Primary Examiner* — Joseph Miller, Jr.
(74) *Attorney, Agent, or Firm* — Perkins Coie LLP

(57) ABSTRACT

An architectural construct is a synthetic material that includes a matrix characterization of different crystals engineered to exhibit certain properties. An architectural construct can be fabricated by a process involving layer deposition, formation, exfoliation and spacing. In one aspect, purified methane can be dehydrogenated onto a substrate by applying heat through the substrate. Deposited carbon can form a plurality of layers of a matrix characterization of crystallized carbon through self-organization. The layers can be exfoliated and spaced to configure parallel orientation at a desired spacing and thickness using selected precursors and applying heat, pressure, or both. The desired architectural construct can further be stabilized and doped to exhibit desired properties.

16 Claims, 17 Drawing Sheets

(56) References Cited

U.S. PATENT DOCUMENTS

| | | | |
|---|---|---|---|
| 8,147,599 | B2 | 4/2012 | McAlister |
| 2004/0076561 | A1 | 4/2004 | Kajiura et al. |
| 2004/0191589 | A1 | 9/2004 | Katamura et al. |
| 2004/0247957 | A1 | 12/2004 | Hatano et al. |
| 2006/0216222 | A1 | 9/2006 | Jang |
| 2007/0138006 | A1 | 6/2007 | Oakes et al. |

OTHER PUBLICATIONS

Yasuhiko, JP09-040491, Feb. 1997, Eng machine translation.*

"Electrifying New Way to Clean Dirty Water." University of Utah, Published: Jan. 5, 2011. Accessed: Jun. 1, 2011. <http://www.unews.utah.edu/old/p/010511-1.html>.

"Dopant." Wikipedia, the Free Encyclopedia. Published: Oct. 14, 2010, Accessed: Nov. 11, 2010. Printed: Jun. 1, 2011. <http://en.wikipedia.org/wiki/Dopant>. pp. 1-3.

"Doping (semiconductor)." Wikipedia, the Free Encyclopedia. Published: Oct. 12, 2010. Accessed: Nov. 11, 2010. Printed: Jun. 1, 2011. <http://en.wikipedia.org/wiki/Dopant>. pp. 1-4.

"Expitaxy." Wikipedia, the Free Encyclopedia. Published: Oct. 18, 2010. Accessed: Nov. 11, 2010. Printed: Jun. 1, 2011. <http://en.wikipedia.org/wiki/Dopant>. pp. 1-4.

"Glossary of Semiconductor Physics, Optoelectronic and Photonics." Accessed: Nov. 10, 2010 Printed: Jun. 1, 2011. <http://britneyspears.ac/physics/lipgloss/gloss.htm>. pp. 1-10.

APS Physics. "This Month in Physics History: Oct. 2009." Published: Oct. 2009. Accessed: Jun. 1, 2011. <http://www.aps.org/publications/apsnews/200910/physicshistory.cfm>. pp. 1-3.

Bourzac, Katherine. "Bringing Graphene to Market." Technology Review. Published: Aug. 6, 2009. Accessed: May 31, 2011. <http://www.technologyreview.com/printer_friendly_article.aspx?id=23129>. pp. 1-2.

Carmody, Tim. "Why Graphene Won Scientists the Nobel Prize." Wired, Published: Oct. 5, 2010. Accessed: May 31, 2011. <http://www.wired.com/gadgetlab/2010/10/graphene/>. pp. 1-7.

Cho, Adrian. "Still in Its Infancy, Two-Dimensional Crystal Claims Prize." Science. Oct. 8, 2010. p. 159. <http://www.sciencemag.org/cgi/content/full/330/6001/159>.

CNN Wire Staff. "Research into Graphene Wins Nobel Prize." CNN.com. Published: Oct. 5, 2010. Accessed: Jun. 1, 2011. <http://edition.cnn.com/2010/LIVING/10/05/sweden.nobel.physics/index.html?hpt=T2>. pp. 1-2.

Elias et al. "Control of Graphene's Properties by Reversible Hydrogenation: Evidence for Graphane." Science. Jan. 30, 2009. pp. 610-613. <http://www.sciencemag.org/cgi/content/full/323/5914/610>.

Geim, A.K. "Graphene: Status and Prospects." Science. Jun. 19, 2009 pp. 1530-1534. <http://www.sciencemag.org/cgi/content/full/324/5934/1530>.

Kuzmenko et al. "Universal Optical Conductance of Graphite." Physical Review Letters, vol. 100, Issue 11. Mar. 21, 2008. pp. 117401-1-117401-4.

Nair et al. "Fine Structure Constant Defines Visual Transparency of Graphene." Science. Jun. 6, 2008. p. 1308. <http://www.sciencemag.org/cgi/content/full/320/5881/1308>.

Novoselov et al. "Electric Field Effect in Atomically Thin Carbon Films." Science. Oct. 22, 2004. pp. 666-669. <http://www.sciencemag.org/cgi/content/full/306/5696/666>.

Novoselov et al. "Room-Temperature Quantum Hall Effect in Graphene." Science. Feb. 15, 2007. p. 1379. <http://www.sciencemag.org/cgi/content/full/315/5817/1379>.

Patel, Prachi. "Graphene Could Improve DNA Sequencing." Technology Review, Published: Aug. 19, 2010. Accessed: May 31, 2011. <http://www.technologyreview.com/printer_friendly_article.aspx?id=26087>. pp. 1-2.

Ponomarenko et al. "Chaotic Dirac Billiard in Graphene Quantum Dots." Science. Apr. 18, 2008. pp. 356-358. <http://www.sciencemag.org/cgi/content/full/320/5874/356>.

Rincon, Paul. "Materials Breakthrough Wins Nobel." BBC News, Published: Oct. 5, 2010. Accessed: Jun. 9, 2011. <http://www.bbc.co.uk/news/world-11476301?print=true>. pp. 1-4.

Sun et al. "High-pressure Laminar Flame Speeds and Kinetic Modeling of Carbon Monoxide/hydrogen Combustion." Proceedings of the Combustion Institute, vol. 31, Issue 1, (2007). pp. 439-446.

European Search Report for Application EP 11742993.6; Dated Dec. 12, 2013; 5 pages.

International Search Report and Written Opinion for PCT Application No. PCT/US2012/050629; Applicant McAlister Technologies, LLC; Date of Mailing: Feb. 18, 2013; 12 pages.

* cited by examiner

US 8,828,491 B2

METHODS FOR MANUFACTURING ARCHITECTURAL CONSTRUCTS

CROSS-REFERENCE TO RELATED APPLICATION(S)

The present application claims priority to U.S. Provisional Application No. 61/526,185, filed on Aug. 22, 2011, and U.S. Provisional Application No. 61/523,261, filed on Aug. 12, 2011, both of which are incorporated herein by reference. To the extent the foregoing provisional application and/or other materials incorporated herein by reference conflict with the present disclosure, the present disclosure controls.

TECHNICAL FIELD

The present technology relates to a material that includes a matrix characterization of different crystals.

Background

Technology has progressed more during the last 150 years than during any other time in history. Integral to this age of innovation has been the exploitation of the properties exhibited by both new and existing materials. For example, silicon, being a semiconductor, has been transformed into processors; and steel, having a high tensile strength, has been used to construct the skeletons of skyscrapers. Future innovations will similarly depend on exploiting the useful properties of new and existing materials.

A material's usefulness depends on its application. A material that exhibits a combination of useful properties is especially useful because it may enable or improve some technology. For example, computer processors rely on multitudes of transistors, each of which outputs a voltage equivalent to a binary 1 or 0 depending on its input. Few materials are suitable as transistors. But semiconductor materials have unique properties that facilitate a transistor's binary logic, making semiconductors especially useful for computer hardware.

Technology will continue to progress. Engineers and scientists will continue to create novel inventions. Implementing these ideas will depend on materials that can be configured to behave in new and desirable ways.

DETAILED DESCRIPTION

Overview

Figure 1A:
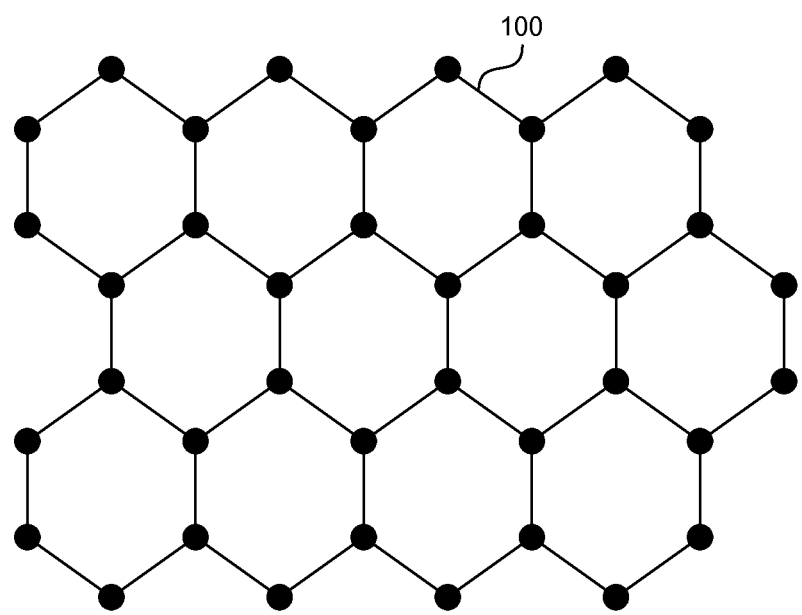
FIG. 1A is a diagram showing a molecular structure of a matrix characterization of crystals.

Architectural constructs as described herein are configurable so that they may exhibit useful properties. An architectural construct includes a synthetic matrix characterization of crystals. These crystals can be primarily composed of carbon, boron nitride, mica, or another material. The matrix characterization of crystals can be configured as a solid mass, as flat or curvilinear layers that are as thin as an atom (e.g., graphene), or in other arrangements and variations. In some implementations, an architectural construct includes a matrix characterization of crystals incorporated in a non-crystalline matrix, such as a glass or polymer. In some implementations, an architectural construct includes a matrix characterization of crystals that has been loaded with a substance, such as hydrogen. In some implementations, an architectural construct is configured to have particular mechanical properties. The crystals of an architectural construct have matrix attributes or arrangements. The crystals of an architectural construct are specialized (e.g., arranged in a specific configuration) so that the architectural construct exhibits particular properties. Five sets of properties of an architectural construct are especially exploitable technologically: (i) a construct's thermal properties; (ii) its electrical, magnetic, electromagnetic, optical, and acoustic properties; (iii) its chemical and catalytic properties; (iv) its capillary properties; and (v) its sorptive properties.

An architectural construct can be designed to utilize some or all of these properties for a particular application. As discussed in detail below, an architectural construct's behavior depends on its composition, the surface structures located on its layers, its layer orientation, completeness or incompleteness of lattice site occupancy, its edge characteristics, its dopants, and the coatings (including catalysts) that are applied to its surfaces. When it is configured as layers, its behavior also depends on the thicknesses of its layers, the spacers between its layers, the distances separating its layers, and the means used for supporting and/or separating its layers. An architectural construct can be a micro or a macrostructure designed to facilitate micro-processing including nano-scale events. From a macroscopic standpoint, it can be configured to have a specific density, electrical conductivity, magnetic characteristic, specific heat, optical characteristic, modulus of elasticity, and/or section modulus. And it can be designed so that from a microscopic standpoint it acts as a molecular processor, magnetic domain support, charge processor, and/or bio processor.

Various embodiments of the invention will now be described. The following description provides specific details for a thorough understanding and an enabling description of these embodiments. One skilled in the art will understand, however, that the invention may be practiced without many of these details. Additionally, some well-known structures or functions may not be shown or described in detail in order to avoid unnecessarily obscuring the relevant description of the various embodiments. The terminology used in the description presented below is intended to be interpreted in its broadest reasonable manner, even though it is being used in conjunction with a detailed description of certain specific embodiments of the invention.

Architectural Constructs

An architectural construct includes a synthetic matrix characterization of crystals. The crystals are composed of carbon, boron nitride, mica, or another suitable substance. The configuration and treatment of these crystals will heavily influence the properties that the architectural construct will exhibit, especially when it experiences certain conditions. Many of these properties are described below and are discussed in relation to five categories of properties. These categories include the following: (i) thermal properties; (ii) electrical, magnetic, electromagnetic, optical, and acoustic properties; (iii) chemical and other catalytic properties; (iv) capillary properties; and (v) sorptive properties. Although they are grouped in this way, properties from different sets are sometimes interrelated or associated with one another. Accordingly, an architectural construct can be configured to exhibit some or all of the properties discussed throughout this specification.

An architectural construct can be configured in many ways. A designer can arrange it as a solid mass (e.g., as multiple single-atom-thick layers stacked in various orientations upon one another), as multiple layers that are spaced apart and as thin as an representative atom, or in another configuration through which it will exhibit a desirable property. A designer can also dope the construct or coat selected portions its surfaces with a substance or with surface structures, each of which will cause it to behave in a different way than it would have otherwise. For example, surfaces of an architectural construct can be coated or reacted in various ways with surface structures or coatings composed of carbon, boron, nitrogen, silicon, sulfur, and/or transition metals. These and other variations are detailed further below with reference to various implementations of architectural constructs.

FIG. 1A shows a molecular diagram of a layer of a matrix characterization of crystals 100 according to some implementations. The layer may include carbon, boron nitride, mica, or another suitable material. For example, the matrix characterization of crystals 100 may be a layer of graphene. A layer of a matrix characterization of crystals like that shown in FIG. 1A can be configured as an architectural construct by specializing the layer, such as by doping the layer or arranging the layer with other layers in a particular configuration so that the resulting construct including one or more edges exhibits one or more characteristics or a particular property.

Figure 1B:
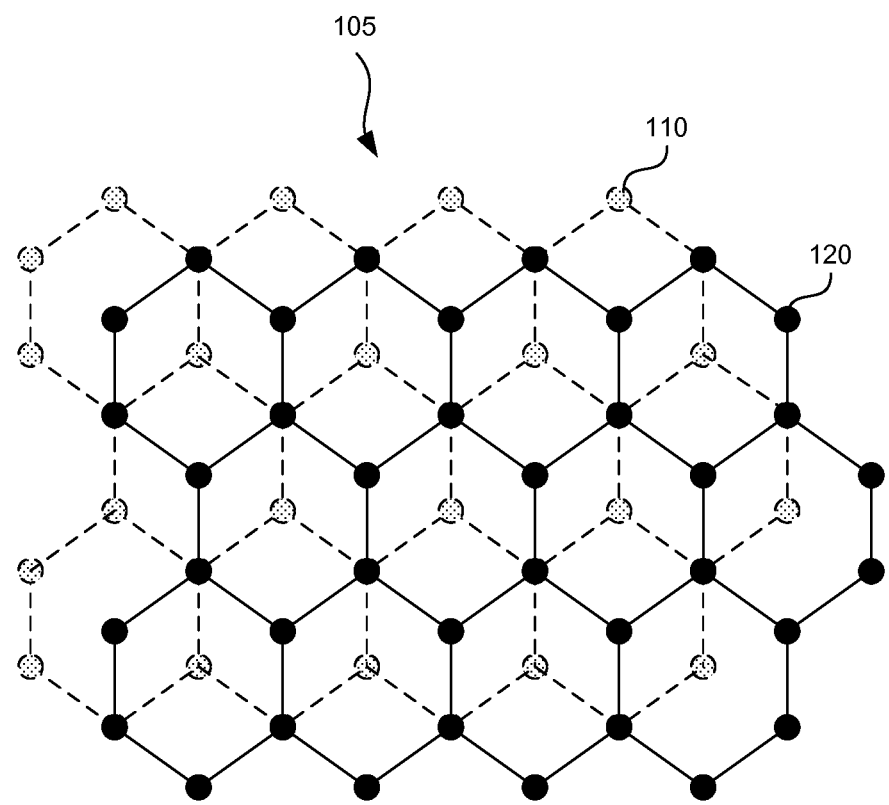
FIG. 1B is a diagram showing a molecular structure of two layers of a matrix characterization of crystals of an architectural construct.
Figure 1C:
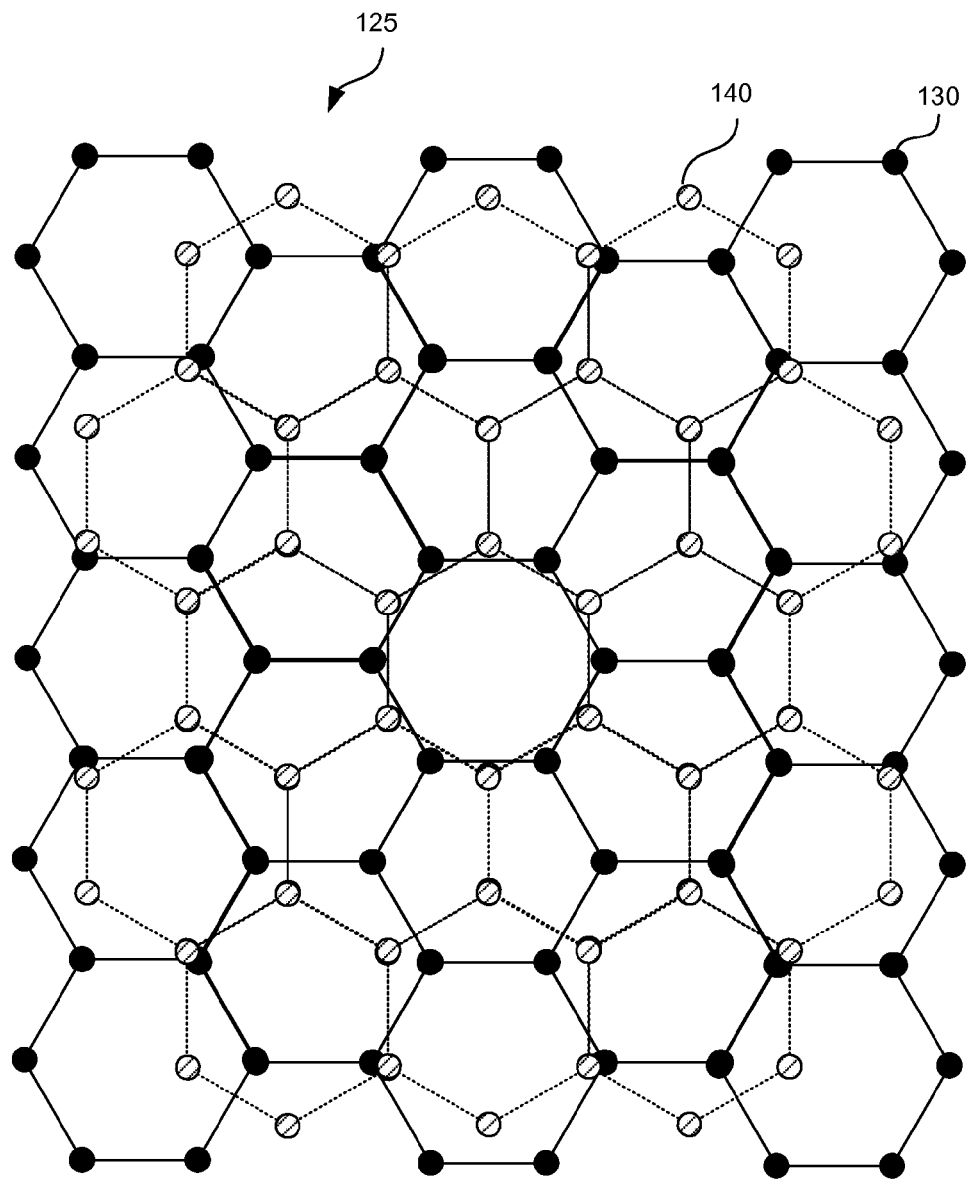
FIG. 1C is another diagram showing a molecular structure of two layers of a matrix characterization of crystals of an architectural construct.

Layers of a matrix characterization of crystals that combine to form an architectural construct can be configured and stacked together as a layer that is thicker than an atom (e.g., graphene stacked to form graphite) and/or spaced apart from one another by particular distances. Furthermore, layers of an architectural construct can be oriented with respect to one another in various ways. FIG. 1B shows a diagram of an architectural construct 105 that includes a first layer 110 of a matrix characterization of crystals arranged on a second layer 120 of a matrix characterization of crystals. The first layer 110 is offset and parallel relative to the second layer 120 so that when viewed from above some atoms of the first layer 110 align within the zone between atoms of the second layer. In the example shown, each atom of the first parallel layer is approximately centered within a hexagon formed by atoms of the second layer 120. In some implementations, the first and second layers of an architectural construct are configured so that the atoms of the first layer and the atoms of the second layer align vertically. For example, a structural diagram of an architectural construct where the atoms of two layers align vertically is represented by FIG. 1A. FIG. 1C shows a molecular diagram of an architectural construct 125 that includes a first layer 130 and a second layer 140 of a matrix characterization of crystals. In this embodiment, the first layer 130 is illustratively rotated 30 degrees relative to the adjacent layer. In alternative embodiments, the first layer may be rotated more or less than 30 degrees relative the adjacent or second layer. In some implementations, the first layer of an architectural construct includes a first substance, such as carbon, and the second layer of the construct includes a second substance, such as boron nitride. Layers composed of or doped with different substances may not appear planar as larger molecules may warp or increase the separation of planar surfaces. As further detailed below, some properties of an architectural construct are influenced by the orientation of its layers relative to one another. For example, a designer can rotate or shift the first layer of a construct relative to the second layer of the construct so that the construct exhibits particular optical or catalytic properties, including a specific optical grating and/or chemical process improvement.

Figure 2:
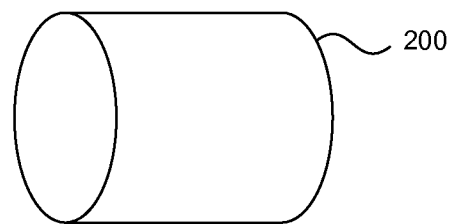
FIG. 2 is an isometric view of an architectural construct configured as a solid mass.

FIG. 2 shows an isometric view of an architectural construct 200 that is configured as a solid mass. The architectural construct 200 can include, for example, graphite or boron nitride. An architectural construct configured as a solid mass includes multiple single-atom-thick layers stacked together in various orientations including flat and curvilinear arrays. An architectural construct configured as a solid mass is specialized, meaning it has been altered to behave in a specific way. In some implementations, a solid mass is specialized by doping or by orienting its single-atom-thick layers a particular way with respect to one another.

An architectural construct can be composed of a single substance (e.g., boron nitride), or graphite, graphene and diamond, or it can be specialized by being doped or reacted with other substances. For example, an architectural construct including graphene may have areas that are reacted with boron to form both stoichiometric and non-stoichiometric subsets. The graphene can be further specialized with nitrogen and can include both carbon graphene and boron nitride graphene with a nitrogen interface. In some implementations, compounds are built upon the architectural construct. For example, from a boron nitride interface, a designer can build magnesium-aluminum-boron compounds. In some implementations, the edges of a layer of an architectural construct are reacted with a substance, for example, silicon may be bonded on the edges to form silicon carbide, which forms stronger bonds between the construct and other matter. Other reactions could be carried out to change the construct's optical characteristics or another property such as specific heat. By specializing an architectural construct in such ways, a designer can create a construct that exhibits properties that are different than those of a construct composed of only one type of atom.

Figure 3:
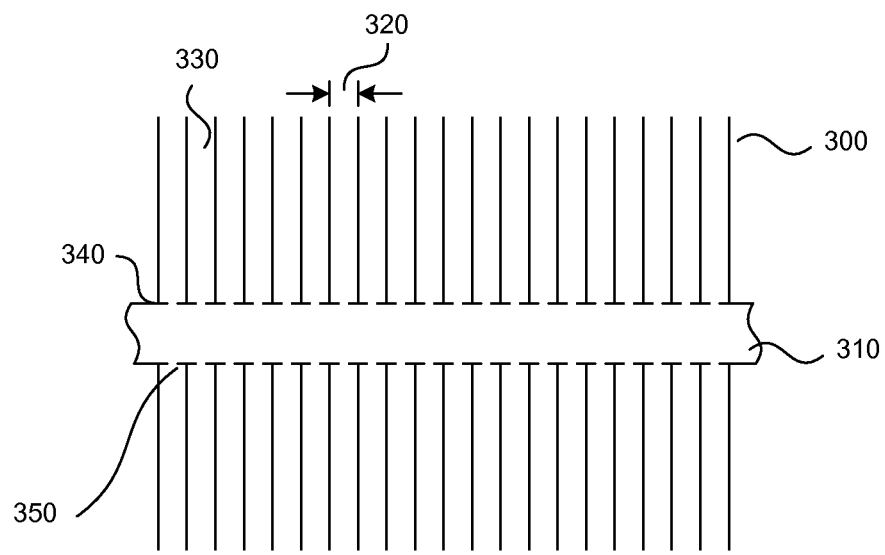
FIG. 3 is a cross-sectional side view of an architectural construct configured as parallel layers.

Architectural constructs that include parallel layers spaced apart from one another are capable of yielding a wide range of properties and achieving many outcomes. FIGS. 3-11 show architectural constructs configured according to some implementations. FIG. 3 is a cross-sectional side view of an architectural construct 300 configured as parallel layers. The parallel layers of an architectural construct may be comprised of any of a number of substances, such as graphene, graphite, or boron nitride. Parallel layers may be rectangular, circular, or another shape. In FIG. 3, the layers are circular and include a hole through which a support tube 310 supports the architectural construct 300. The layers are each separated by a distance 320, which characterizes physical, chemical, mechanical, optical and electrical properties and conditions in zones 330 between the layers.

There are a number of approaches for creating architectural constructs like those shown in FIGS. 1-11. One is to deposit or machine a single crystal into a desired shape and to heat treat or utilize other methods to exfoliate the single crystal into layers. As an example, the crystal is warm-soaked in a fluid substance, such as hydrogen, until a uniform or non-uniform concentration of the fluid diffuses into the crystal. The crystal may be coated with substances that catalyze this process by helping the fluid enter the crystal. Catalysts may also control the depth to which the fluid diffuses into the crystal, allowing layers that are multiple-atoms thick to be exfoliated from the crystal. Sufficient coatings include the platinum metal group, rare earth metals, palladium-silver alloys, titanium and alloys of iron-titanium, iron-titanium-copper, and iron-titanium-copper-rare earth metals along with various alloys and compounds that may contain such substances. A thin catalyst coating may be applied by vapor deposition, sputtering, or electroplating techniques. The coatings may be removed after each use and reused on another crystal after it has allowed the entry and diffusion of fluid into the crystal. In some implementations, dopants or impurities are introduced into the crystal at a particular depth to encourage the fluid to diffuse to that depth so that layers that are multiple-atoms thick can be exfoliated from the crystal.

The soaked crystal may be placed in a temporary container or encased in an impermeable pressure vessel. Pressure may be suddenly released from the container or vessel causing the impregnated fluid to move into areas where the packing is least dense and form gaseous layers. Gas pressure causes the exfoliation of each plane. Additional separation can be created by repeating this process with successively larger molecules, such as methane, ethane, propane, and butane. The 0001 planes can be separated by a particular distance by controlling the amount and type of fluid that enters the crystal and the temperature at the start of expansion. The layers of the architectural construct can be oriented in a position with respect to one another (i.e., offset and/or rotated as discussed above with respect to FIGS. 1A-C) by applying trace crystal modifiers, such as neon, argon, or helium, at the time of a layer's deposition using a heat treatment that moves the structure to a particular orientation or by application of torque and/or vibration to the crystal during exfoliation.

In some implementations, before it is exfoliated, one or more holes may be bored in the crystal so that it will accommodate a support structure, like the fluid conduit and/or support tube 310 that supports the architectural construct 300 illustrated in FIG. 3. A support structure may be configured within a crystal before it is exfoliated to support the architectural construct as it is created. The support structure can also be placed in the architectural construct after the crystal has been exfoliated. A support structure may also be used to fix the layers of an architectural construct at a particular distance apart from one another. In some implementations, a support structure may be configured along the edges of an architectural construct's layers (e.g., as a casing for an architectural construct that is comprised of parallel layers).

Figure 4:
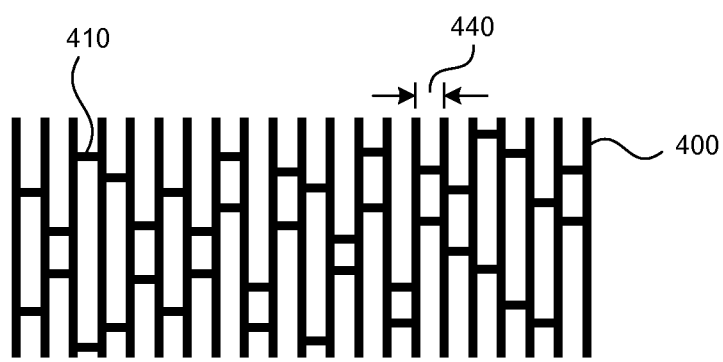
FIG. 4 is a side view of an architectural construct configured as parallel layers.

Layers of an architectural construct can be made to have any thickness. In FIG. 3, each of the parallel layers of the architectural construct 300 is an atom thick. For example, each layer may be a sheet of graphene. In some implementations, the layers of the architectural construct are thicker than one atom. FIG. 4 is a side view of an architectural construct 400 configured as parallel layers. In the section shown, the layers of the architectural construct 400 are each thicker than one atom. For example, as discussed above with respect to FIGS. 1A-C, each layer may include multiple sheets of graphene stacked upon one another in any of the orientations of FIG. 1A, 1B or 1C. An architectural construct may include parallel layers that are only one atom thick, a few atoms thick, or layers that are much thicker, such as 20 atoms or more.

Figure 5:
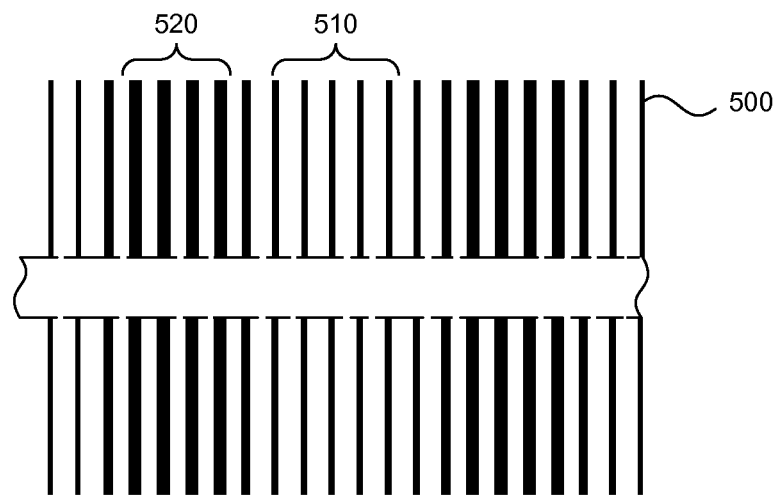
FIG. 5 is a cross-sectional side view of an architectural construct configured as parallel layers.

In some implementations, all the layers are the same thickness, while in other implementations the layers' thicknesses vary. FIG. 5 is a cross-sectional side view of an architectural construct 500 configured as parallel layers that have various thicknesses. As discussed above, layers thicker than an atom or differing from one another in thicknesses may be exfoliated from a single crystal by controlling the depth to which a fluid is diffused into the crystal (e.g., by introducing impurities or dopants at the desired depth).

When an architectural construct is configured as parallel layers, the layers may be spaced an equal distance apart or by varying distances. Referring again to FIG. 3, an approximately equal distance 320 separates each of the parallel layers characterizing zones 330. In FIG. 5, the distances between the layers of the architectural construct 500 vary. For example, the distance between the layers of a first set 510 of layers is greater than the distance between the layers of a second set 520 of layers, meaning that the zones between the layers of the first set 510 are larger than those of the second set 520.

A number of techniques can be used to arrange one layer a particular distance from another layer. As mentioned above, one method is to configure the parallel layers on a support structure and exfoliate each layer so that there is a certain distance between it and an adjacent layer. For example, a manufacturer can control both the volume of fluid and the distance that it is diffused into a single crystal when exfoliating a layer. Another method is to electrically charge or inductively magnetize each exfoliated layer and electrically or magnetically force the layers apart from one another. Diffusion bonding or using a suitable adherent can secure the layers in place on the central tube at a particular distance away from one another.

Another technique for establishing a particular distance between the layers is to deposit spacers between the layers. Spacers can be composed of atoms of metals, non-metals or semiconductors such as carbon and titanium (e.g., to form diamond or titanium carbide with a graphene layer), iron (e.g., to form iron carbide with a graphene layer), boron, nitrogen, etc. Referring again to FIG. 4, the parallel layers 400 are separated with spacers 410. In some implementations, a gas is dehydrogenated on the surface of each layer, creating the spacers 410 where each particle or molecule is dehydrogenated. For example, after a layer of an architectural construct is exfoliated, methane may be heated on the surface of the layer causing the methane molecules to split and deposit carbon atoms on the surface of the layer. The larger the molecule that is dehydrogenated, the larger the potential spacing. For example, propane, which has three carbon atoms per molecule, will create a larger deposit and area or space than methane, which has one carbon atom per molecule. In some implementations, parallel layers are configured on a central tube and the spacers are included between the layers. In some implementations, the spacers are surface structures, like nanotubes and nanoscrolls, which transfer heat and facilitate in the loading or unloading of substances into an architectural construct. Architectural constructs that include these types of surface structures are described below with respect to FIGS. 10 and 11.

Figure 6:
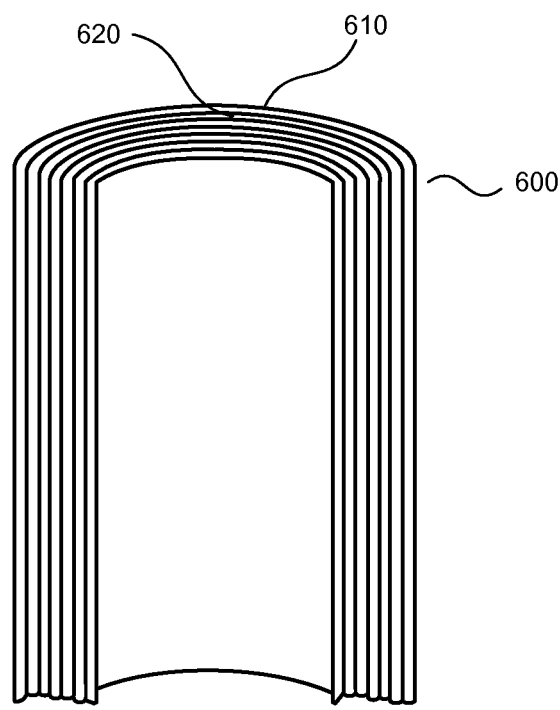
FIG. 6 is a cross-sectional side view of an architectural construct configured as concentric tubular layers.

FIG. 6 shows a cross-sectional side view of an architectural construct 600 configured as concentric tubular layers of a matrix characterization of crystals. For example, a first layer 610 of the architectural construct is tubular and has a diameter greater than a second layer 620 of the architectural construct, and the second layer 620 is configured within the first layer 610. An architectural construct configured as concentric tubes can be formed in many ways. One method is to dehydrogenate a gas, such as a hydrocarbon, within a frame to form the first layer 610 of the architectural construct 600, and to dehydrogenate a substance, such as titanium hydride, to form spacers (e.g., surface structures) on the inside surface of the first layer before dehydrogenating the first gas to form the second layer 620 on the spacers. Subsequent layers can then be deposited in a similar fashion. In some implementations, each tubular layer is formed by dehydrogenating a gas in its own frame. The dehydrogenated layers are then configured within one another in the configuration shown in FIG. 6. Spacers can be deposited on either the inside or outside surfaces of the layers to space them apart by a particular distance. In other instances, multiple wraps of a material such as polyvinyl fluoride or chloride are dehydrogenated to produce the desired architectural construct. In other instances, polyvinylidene chloride or fluoride is dehydrogenated to produce the desired architectural construct.

Figure 7:
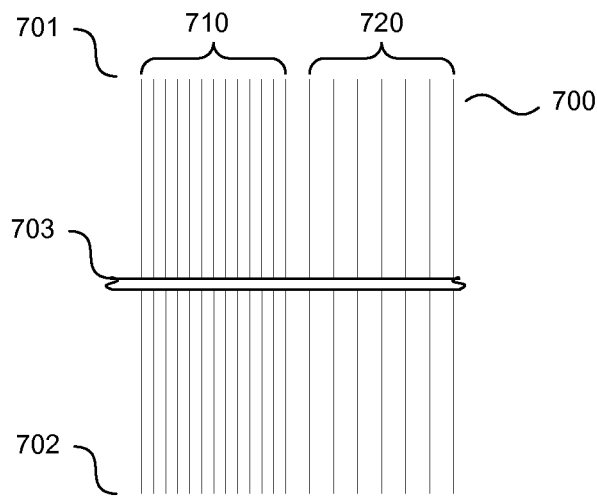
FIG. 7 is a cross-sectional side view of an architectural construct configured as parallel layers.
Figure 8:
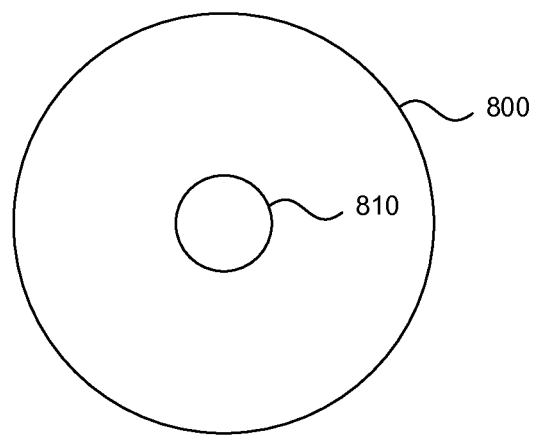
FIG. 8 is a side view of a layer of an architectural construct.
Figure 9:
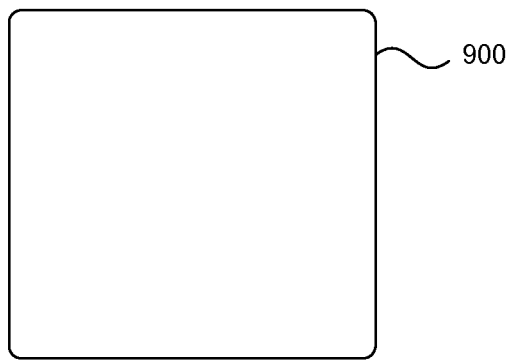
FIG. 9 is another side view of a layer of an architectural construct.

FIG. 7 is a cross-sectional side view of an architectural construct 700 comprised of parallel layers. The architectural construct 700 includes a first set 710 of layers where the layers are spaced apart by a closer distance than the layers in a second set 720 of layers. The architectural construct 700 is discussed in further detail below with reference to some of the properties that it exhibits in this configuration. FIG. 8 is a side view of a layer 800 of an architectural construct. The layer 800 has a circular shape, and it includes a hole 810, through which a support structure may support the layer 800. FIG. 9 is a side view of a layer 900 of an architectural construct that has a rectangular shape with rounded corners. As mentioned above, if a layer is exfoliated from a single crystal, it can be machined into a particular shape either before or after exfoliation. Multiple layers like the layer 900 can be arranged together via, for example, a support structure configured on its edges or spacers configured on their surfaces. In some implementations, the surface of an architectural construct is treated with a substance. For example, the surface of an architectural construct can be coated with at least one of carbon, boron, nitrogen, silicon, sulfur, transition metals, carbides, and borides, which causes the architectural construct to exhibit a particular property including properties developed by solid solutions or compounds that may be formed. For example, as discussed below, the surface of an architectural construct can be treated so that it includes silicon carbide, which may change its electromagnetic and/or optical properties.

In some implementations, an architectural construct is semi-permanent or a constituent or donor is configured to be non-sacrificial. For example, as explained below, an architectural construct can be configured to load molecules of a substance into zones between layers of the construct. A non-sacrificial construct can load and unload substances or perform other tasks without sacrificing any of its structure. In other implementations, an architectural construct is configured to sacrifice atoms from its crystalline structure at certain times or occasions to facilitate a particular result. For example, an architectural construct that is composed of boron nitride may be configured to load nitrogen, whose reaction with hydrogen the boron nitride will facilitate in order to form ammonia and/or other nitrogenous substances. As a result, atoms from the construct will be sacrificed during the reaction with hydrogen, and when the product is unloaded from the construct, the architectural construct will have lost the sacrificed molecules of boron nitride. In some implementations, a construct that has sacrificed its structure can be restored or cyclically utilized in such reactions. For example, an architectural construct that is composed of boron nitride can be restored by presenting the construct with new nitrogen, boron, and/or boron nitride molecules and applying heat or another form of energy such as electromagnetic radiation. The new boron nitride structure may self-organize the replacement of the missing atoms into the original architectural construct.

An architectural construct can be designed to have certain properties such as a specific density, modulus of elasticity, specific heat, electrical resistance, and section modulus. These macroscopic characteristics affect the properties that an architectural construct exhibits. A construct's density is defined as its mass per unit volume. A number of different parameters affect an architectural construct's density. One is the composition of the matrix characterization of crystal. For example, a crystal of boron nitride generally has a higher density than a crystal of graphite, depending upon factors such as those disclosed regarding FIGS. 1A, 1B and 1C. Another is the distance separating the layers of an architectural construct. Increasing or decreasing the spacing between the layers will correspondingly increase or reduce an architectural construct's density. An architectural construct's density may also be greater in embodiments where its layers are spaced apart by denser surface structures relative to embodiments where the layers are similarly spaced but not by surface structures. An architectural construct's dopants can also change its density and thus various related properties as desired.

An architectural construct's modulus of elasticity is its tendency to be deformed elastically when a force is applied to it (defined as the slope of its stress-strain curve in the elastic deformation region). Like its density, an architectural construct's modulus of elasticity depends in part on the thicknesses of its layers, their spacing, and their composition. Its modulus of elasticity will also depend on whether the layers are electrically charged and how the layers are fixed relative to one another and if the space between layers contains a gas and the pressure of the gas. If the layers are supported by a central tube, like the support tube 310 of the architectural construct 300 shown in FIG. 3, the individual layers can generally elastically deform by a greater amount than if they are fixed relative to one another using spacers, like the spacers 410 between the layers of the architectural construct 400 shown in FIG. 4. For the most part, when spacers fix two layers relative to one another, each layer will reinforce the other when force is exerted on either, dampening the deflection that results from a given force. The amount that each layer reinforces each other layer is contingent, in part, on the concentration of spacers between the layers and how rigidly the spacers hold the layers together.

An architectural construct's section modulus is the ratio of a cross section's second moment of area to the distance of the extreme compressive fiber from the neutral axis. An architectural construct's section modulus will depend on the size and shape of each layer of architectural construct. For example, the section modulus of a rectangular layer of architectural construct is defined by the following Equation 1:

$$S = \frac{bh^2}{6}, \quad (1)$$

where b is the base of the rectangle and h is the height. And the section modulus of a circle with a hole in its center is defined by the following Equation 2:

$$S = \frac{\pi(d_2^4 - d_1^4)}{32 d_2}, \quad (2)$$

where $d_2$ is the diameter of the circle and $d_1$ is the diameter of the hole in the circle.

An architectural construct's density, modulus of elasticity, and section modulus can be constant throughout the architectural construct or they can vary by section or cyclically. Just as a construct's density, modulus of elasticity, or section modulus can affect the properties the construct exhibits, varying these macroscopic characteristics either by section or cyclically can cause the architectural construct to behave differently at different parts of the construct. For example, by separating an architectural construct's layers in a first section by a greater amount than in a second section (thereby giving it a greater density in the second section than in the first), the architectural construct can be made to preferentially load a first substance in the first section and a second substance in the second section. In some implementations, an architectural construct is configured to have particular mechanical properties. For example, an architectural construct can be configured as a support structure for an object. In some implementations, an architectural construct is configured to have at least one of a particular fatigue endurance strength, yield strength, ultimate strength, and/or creep strength. In some implementations, an architectural construct is configured to have a particular property, including these and the others discussed herein, including various anisentropic influences on the property.

I. Thermal Properties

An architectural construct can be configured to have specific thermal properties. Even when its crystalline layers readily conduct heat, an architectural construct can be configured to have either a high or low availability for conductively transferring heat. Illustratively, conduction that is perpendicular to the layers may be inhibited by the choice of spacing and spacers. It can also be configured so that radiative heat is transmitted through passageways or elsewhere within the construct, reflected away from the construct, or absorbed by the construct. This section describes various implementations of architectural constructs that are designed to have specific thermal behaviors.

A one-atom-thick graphene layer could be seen as mostly open space between defining carbon atoms. However, graphene provides extremely high thermal and electrical conductivity in directions within the plane of atoms, yet only about 2.3% of the white light that strikes it will be absorbed. Similarly about 2% to 5% of the thermal energy spectrum radiated orthogonally at the place of atoms is absorbed while radiative heat rays parallel to the separated architectural construct layers can be transmitted with even less attenuation. The net amount of light that an architectural construct absorbs depends in part on the orientation of successive layers relative to one another. Variations in the orientations of the layers of an architectural construct, as discussed above with reference to FIGS. 1A-C, can enable various new applications. For example, radiative energy can be delivered to sub-surface locations via more absorptive orientations, such as the orientation shown in FIG. 1B. As another example, radiation can be polarized via orientations such as that shown in FIG. 1C; this orientation can be further modified by offsetting a layer in the direction of its plane by a certain amount, such as described above with respect to FIGS. 1A and 1B. For a further discussion of graphene's properties, optical and otherwise, see R. R. Nair, P. Blake, A. N. Grigorenko, K. S. Novoselov, T. J. Booth, T. Stauber, N. M. R. Prees and A. K. Geim, *Fine Structure Constant Defines Visual Transparency of Graphene*, 320 SCIENCE 1308 (2008); A. B. Kuzmenko, E. van Heumen, F. Carbone, and D. van der Marel, *Universal Optical Conductance of Graphite*, DPMC, University of Geneva, 1211 Geneva 4, Switzerland (2008).

Some crystalline substances, like graphene, graphite, and boron nitride, readily conduct heat in certain directions. In some applications, an architectural construct composed of one of these substances is configured to transfer heat between two locations or away from or to a particular location. In other applications, the architectural construct is configured so that heat may be efficiently transferred into and out of the construct as needed. An architectural construct composed of a substance like graphene can be rapidly heated or cooled. Despite having a much lower density than metal, an architectural construct can conductively transfer a greater amount of heat in desired directions per unit area than solid silver, raw graphite, copper, or aluminum.

An architectural construct can be arranged so that it has a high availability for conductively transferring heat by configuring the construct to have a high concentration of thermally conductive pathways through a given cross section of the construct. An architectural construct can be arranged to have a low availability for conductively transferring heat by configuring the construct to have a low concentration of thermally conductive pathways through a given cross section of the construct. For example, FIG. 7 shows the architectural construct 700 configured as parallel layers that are rectangular and supported by a central support structure 703. A first set 710 of parallel layers is composed of layers that are more or less equally thick such as an atom thick and are spaced a first distance away from one another. A second set 720 of layers is composed of layers that may similarly be an atom thick and are spaced a second distance away from one another that is greater than the first distance. Because of the a higher concentration of thermal passageways over the span of the first set 710 of parallel layers than over the span of the second set 720 of layers (the sets of layers span approximately the same distance), the first set has a higher availability for conductively transferring heat than the second set. It follows that the second set 720 does a better job than the first set 710 of thermally insulating an object located at a first side 701 of the construct from an object located on a second side 702 and for providing insulation against heat transfer parallel to the longitudinal axis of support 703.

In some implementations, an architectural construct configured as parallel layers is arranged to insulate a surface which the layers are not orthogonal to. For example, the architectural construct can be configured so its layers contact a flat surface at an angle such as 45 degrees by offsetting the edges of consecutive layers by a particular amount so that the layers achieve this angle with the surface when placed against it. In some implementations, an architectural construct may be arranged to have a higher availability for conductively transferring heat by configuring it to have thicker layers. For example, referring again to FIG. 5, there is a higher availability for thermally transferring heat through the second set 520 of layers than through the first set 510 because the second set of layers is thicker than the first and spaced closer together. In some implementations, an architectural construct includes surface structures, such as on the architectural construct 1000 shown in FIG. 10, which facilitates the conductive transfer of heat within the construct.

As discussed below with reference to an architectural construct's electromagnetic and optical properties, an architectural construct can be arranged to transmit, diffract, reflect, refract, or otherwise transform radiant energy. Accordingly, an architectural construct may be configured to interact in a specific way with radiant heat. In some implementations, an architectural construct is configured to transmit radiant heat through passageways within the construct. This transfer of radiant heat can enable endothermic or exothermic reactions that are facilitated by catalytic presentation of reagents and/or reactants by energy transfers at the speed of light. A construct's properties related to radiant heat transfer can be altered by including surface structures on the layers of the construct, which may absorb or reflect specific wavelengths. Reactants are oriented, held in place, and heated or cooled as products are removed by the interaction with architectural construct planes including dopants and application of continuous, intermittent or occasional electric charge and/or radiation.

Radiation gratings with various slot widths can be fabricated as spacings between layers or by electron beam lithography (e-beam), and their infrared transmission of the transverse magnetic mode (TM mode) provides for Fourier Transform Infrared Spectroscopy (FTIR). This, along with local dopants, provides the basis for integrated subcircuits and systems that serve as infrared photodetectors, bio-chip sensors, and light-emitting diode polarizers. U.S. patent application Ser. No. 12/064,341, filed on Aug. 4, 2008 and titled "INFRARED COMMUNICATION APPARATUS AND INFRARED COMMUNICATION METHOD," the teachings of which are incorporated herein by reference, describes some exemplary systems.

Referring again to FIG. 7, the second set 720 of layers may be spaced apart a particular distance, composed of a particular substance, and configured to have a particular thickness so that incident infrared energy that is parallel to the layers enters and is transmitted through zones between the layers. For example, to transmit radiant energy of a particular frequency, an architectural construct can be comprised of layers of boron nitride that are spaced apart according to quantum mechanics relationships. Similarly, as previously noted, an architectural construct can also be configured to specifically absorb radiant energy involving many layers or at discrete locations on or between layers. For example, the layers of the first set 710 of layers may be spaced apart at a particular distance, be composed of a particular substance, and be a particular thickness so that at least a portion of incident infrared energy is absorbed by the layers. Opacity of each individual layer or of a suspended layer is 2.3% of the orthogonal radiation as established by quantum electrodynamics. Opacity of a group of layers depends upon their spacings, the orientations of the architectural construct's layers, the interactions of relativistic electrons within the layers and the selection of spacers, such as the surface structures.

An architectural construct can also be arranged to insulate an object from radiative energy, including radiant heat. In some implementations, an architectural construct can insulate an object from radiant heat by reflecting the radiant energy or by transmitting the radiant energy through passageways around or away from the object. For example, referring to FIG. 4, an architectural construct can be configured to insulate an object placed on the right side of the architectural construct 400 from a radiation source on the left side of the construct.

An architectural construct's thermal properties can also be changed by adding a coating to the surfaces of the construct or by doping the construct. For example, referring again to FIG. 4, the architectural construct 400 can be doped as it is self-organized or by diffusion or ion implantation to increase its thermal conductivity generally or in specific areas or directions. It can also be coated with metals, such as aluminum, silver, gold, or copper, to reflect specific frequencies or more radiant heat than it would have otherwise.

II. Acoustic, Electromagnetic, and Optical Properties

Architectural constructs can be made to exhibit specific properties in response to radiant or acoustic energy. They can be configured to acoustically and/or electromagnetically resonate at specific frequencies. They can also be constructed to have a particular index of refraction, and they can be designed to shift the frequency of incident electromagnetic waves. These properties can be controlled by arranging a construct to have a particular configuration, including a specific density, modulus of elasticity, and section modulus. As discussed above, these parameters can be adjusted by changing the composition of an architectural construct, its treatment, and its design.

An architectural construct's acoustic resonance frequency changes with a number of factors including the choices of various substances and related properties and may be designed to resonate at a lower or higher frequency than conventional materials. Accordingly, when an architectural construct is configured as parallel layers, and according to the presence and locations and densities of pillars or separators, a thin layer may be configured to have a higher resonant frequency than a thicker layer. An architectural construct supported firmly on its edges will resonate at a lower frequency than one that is supported at its center. Additionally, an architectural construct with a high modulus of elasticity will resonate at a greater frequency than one with a low modulus of elasticity, and an architectural construct with a high section modulus can also resonate at a lower or higher frequency than an architectural construct with a smaller section modulus. For example, referring again to FIG. 5, the second set 520 of layers has an acoustic resonance frequency that is lower than that of the first set 510 of layers. This is because the layers of the second set are thicker than those of the first set and are spaced a shorter distance apart from one another, but are otherwise identical. The resonance frequency of any of the layers of the second set 520 or the first set 510 can be reduced by making the diameter of the layers larger. In some implementations, all the layers of an architectural construct are designed to resonate at the same frequency. An architectural construct's resonant frequency will also depend on its composition. Additionally, in some implementations, dopants and/or coatings are added to an architectural construct to increase or reduce its acoustic resonance frequency along with providing other specialization. An architectural construct's resonance frequency can also be reduced by adding spacers, including surface structures and/or covalent or ionic bonds, between the layers.

An architectural construct can also be configured to resonate electromagnetically at a particular frequency. For example, its density, modulus of elasticity, and section modulus can be chosen for each layer so that the construct or each layer has a particular resonance frequency. For example, referring again to FIG. 5, the second set 520 of layers may have a lower electromagnetic resonant frequency than the first set 510 of layers because the second set has thicker layers than the first set and are configured closer together than the layers of the first set. In some implementations, an architectural construct is doped, and its electromagnetic resonance frequency increases or decreases as a result of the doping.

An architectural construct may provide five dimensional (5D) memory. A femtosecond laser may work with a space variant polarization converter that is incorporated in architectural construct and/or to modify or develop structural relationships to provide optical vortex behavior of light and may provide frequency selectivity along with direction of rotation control. Similarly, an architectural construct can provide a very small, low-power particle accelerator coupled with polarization converters.

An architectural construct may also be configured to absorb radiant energy that is at a particular wavelength. A number of factors influence whether an architectural construct will absorb radiant energy that is at a particular wavelength. For example, referring to FIG. 4, the ability of the architectural construct 400 to absorb radiant energy that is at a particular wavelength depends on the layers' thicknesses, spacing, composition, dopants, spacers (including surface structures), and coatings. In some implementations, an architectural construct is configured to transmit radiant energy that is a first wavelength and absorb and re-radiate energy that is a different wavelength from the received radiant energy. For example, referring again to FIG. 4, the architectural construct 400 may be configured so that the layers are parallel to some but not all incident radiant energy. The parallel layers can be configured to transmit radiant energy that is at any angle including parallel to the layers through the construct and absorb non-parallel radiation and/or to perform polarization functions. In some implementations, a re-radiative substance (e.g., silicon carbide, silicon boride, carbon boride, etc.) is coated on the surfaces of the architectural construct, such as by chemical vapor deposition, sputtering, or otherwise spraying the architectural construct with the substance. Subsequently, when non-parallel radiation contacts the architectural construct, the re-radiative substance absorbs the non-parallel radiation and re-radiates the energy at a different wavelength than that at which the energy was received. For example, silicon carbide can be developed or applied to an architectural construct by making silicon available to form solid solutions and stoichiometric compounds.

As mentioned in the previous example and discussed above with respect to radiant heat, an architectural construct can be configured to transmit radiant energy through radiant passageways in the construct (e.g., through zones between layers). As mentioned above, thermal radiation can be transferred at the speed of light in the areas between the layers. For example, the distance separating the layers of the architectural construct 300 shown in FIG. 3 creates zones 330 between the layers through which radiant energy can be transferred. In some implementations, the sizes of the zones between the layers can be increased allowing more radiant energy to be transmitted. In some implementations, the layers of an architectural construct are spaced apart to polarize incident electromagnetic waves. Also, as discussed above, an architectural construct can be configured to insulate an object from radiation damage or heat transfer. In some implementations, an architectural construct insulates an object from radiation by reflecting the radiant energy. For example, referring to FIG. 4, the architectural construct 400 can be configured to insulate an object placed on the right side of the architectural construct 400 from radiation on the left side of the construct. For example, selected layers can be composed of boron nitride and be spaced apart to reflect electromagnetic radiation within specified wavelengths.

An architectural construct can also be configured to have a particular index of refraction (i.e., an index of refraction within a particular range or an exact value). An architectural construct's index of refraction is a function of, among other variables, the composition of the layers (e.g., boron nitride, graphite, etc.), the thicknesses of the layers, dopants, spacers (including surface structures), sub-circuits that are incorporated and the distances that separate the layers. Referring to FIG. 4, the distance 440 between the parallel layers of the construct 400, and the thicknesses of the layers, may be selected so that the parallel layers of the construct 400 have a particular index of refraction. For example, the layers can be comprised of graphite to have an index of refraction that is adjusted by the spacing between the layers and/or by the addition of adsorbed and/or absorbed substances within the spacings. Additionally, in some implementations, dopants are added to an architectural construct to change its index of refraction. For example, layers of an architectural construct comprised of boron nitride may be doped with nitrogen, silicon or carbon to increase or decrease its index of refraction generally or in selected regions.

An architectural construct's index of refraction may change when a substance is loaded into the architectural construct. For example, an architectural construct existing in a vacuum may have a different index of refraction than when hydrogen is loaded into the construct and expressed as epitaxial layers and/or as capillaries between the epitaxial layers. In some implementations, the index of refraction of a first portion of an architectural construct is different from the index of refraction of a second portion of the architectural construct. For example, referring to FIG. 5, the first set 510 of layers may have a different index of refraction than the second set 520 of layers because the first set of layers is thinner and is spaced apart by a greater distance than the layers in the second set of layers.

An architectural construct can be configured to regionally develop or have a particular diffraction grating by orienting its layers relative to one another in a particular way. As a result, incident electromagnetic waves will diffract through layers of the architectural construct in a predictable pattern. In some implementations, by passing light through layers of an architectural construct and observing how the light is diffracted and refracted (e.g., by observing the diffraction pattern that is produced, if it exists, and the angle that the light is refracted at), it can be determined what unknown substance is loaded on edges or between the layers. For example, an architectural construct may be configured so that atoms from a first layer are aligned with atoms from a second layer when viewed from a position perpendicular to the construct, as in FIG. 1A, producing a predictable diffraction pattern when light is passed through the construct. As discussed above with reference to FIGS. 1A-C, layers of a construct (either spaced apart or stacked atop one another) may be oriented in different ways by offsetting or rotating one layer relative to the other.

III. Catalytic Properties

An architectural construct can be configured to catalyze a reaction in a variety of ways. For example, an architectural construct comprised of parallel layers, like those of FIGS. 3-5, may catalyze a chemical reaction or a biological reaction at an edge of its layers by controlling the temperature of the reaction, by having a particular spacing, charge array and/or configuration that catalyzes the reaction, facilitating heat additional or removal, or by supplying a substance that catalyzes the reaction. An architectural construct can catalyze a reaction by speeding the reaction up, prolonging the presentation of reactants to promote a reaction, enabling the reaction by heat addition or removal, moving or removing products formed by reaction steps or by otherwise facilitating the reaction.

A number of variables can be changed to catalyze a particular reaction. In some implementations, the thicknesses of the layers of an architectural construct are selected so that a reaction is catalyzed. In some implementations, the distances between layers and/or the layers' compositions (e.g., boron nitride, carbon, etc.) are selected so that a reaction is catalyzed. In some implementations, dopants are added to an architectural construct or spacers (including surface structures) of a particular chemistry are added between layers so that a particular reaction is catalyzed.

In some implementations, the parallel layers catalyze a reaction by transferring heat to a zone where a reaction is to occur. In other implementations, the parallel layers catalyze a reaction by transferring heat away from a zone where a reaction is to occur. For example, referring again to FIG. 3, heat may be conductively transferred into the parallel layers 300 to supply heat to an endothermic reaction within the support tube 310. In some implementations, the parallel layers catalyze a reaction by removing a product of the reaction from the zone where the reaction is to occur. For example, referring again to FIG. 3, the parallel layers 300 may absorb alcohol from a biochemical reaction within the support tube 310 in which alcohol is a byproduct, expelling the alcohol on outer edges of the parallel layers, and thus improving the productivity and/or prolonging the life of one or more types of microbes involved in the biochemical reaction.

In some implementations, a first set of parallel layers is configured to catalyze a reaction and a second set of parallel layers is configured to absorb and/or adsorb a product of the reaction. For example, referring again to FIG. 5, the second set 520 of layers may be configured to catalyze a chemical reaction by enabling the reaction between two molecules and the first set 510 of layers may be configured to adsorb a product of the reaction, thus prolonging the length of the chemical reaction.

A reaction can be catalyzed in other ways as well. In some implementations, an architectural construct is electrically charged to catalyze a reaction proximate to the construct. In some implementations, an architectural construct is configured to resonate acoustically at a particular frequency, causing molecules to orient themselves in a way that catalyzes a reaction. For example, the molecules may be oriented to enable a chemical reaction or their adsorption onto the layers. In some implementations, an architectural construct is configured to transmit or absorb radiant energy to catalyze a reaction. For example, referring to FIG. 5, the second set 520 of layers may be configured to absorb radiant energy and transform the radiant energy into heat that the first set 510 of layers uses to facilitate an endothermic reaction. Similarly, surface structures may be configured to absorb radiant energy to heat the construct and facilitate a reaction.

In some implementations, a catalyst is added to an architectural construct to catalyze a reaction proximate to the construct. The catalyst may be applied on the edges of layers of the construct or on the surfaces of the construct. For example, chromia may be applied on the edges of an architectural construct, and the chromia may catalyze a chemical reaction between methane and ozone produced from air using ionized ultraviolet radiation or an induced spark.

IV. Capillary Properties

An architectural construct configured as parallel layers may be arranged so that fluid such as a gas or liquid moves between its layers via intermolecular forces, surface tension, electrostatic and/or other influences of capillary action. Any of a number of variables can be changed so that the parallel layers can perform a capillary action with respect to a particular substance. In some implementations, the layers' composition, surface structures, dopants, and/or thicknesses are selected so that an architectural construct performs a capillary action with respect to a particular substance. In some implementations, the distances between the layers are selected so that the architectural construct performs a capillary action with respect to a particular substance. For example, referring to FIG. 6, each of the concentric layers of the architectural construct 600 may be spaced a capillary distance apart from one another for presenting or producing water, and the architectural construct can force or otherwise deliver water up or through the construct via capillary action.

An architectural construct may be comprised of some layers that are a spaced at capillary distance for a first molecule and some layers that are spaced at a capillary distance for a second molecule. For example, referring to FIG. 5, the first set 510 of layers may be a capillary distance with respect to a first molecule, such as propane, and the second set 520 of layers may be sized to perform a capillary action with respect to a second molecule, such as hydrogen. In this example, hydrogen may be removed or adsorbed to the adjacent graphene layers and additional hydrogen may be absorbed between the boundary layers of hydrogen as provided for specific outcomes in processes such as conversion of propane to propylene by the architectural construct design. Additionally, in some implementations, an architectural construct is configured so that heat can be transferred into or out of the construct to facilitate capillary action or so that a charge can be applied to the layers of an architectural construct to facilitate the chemical process by facilitating capillary action.

V. Sorptive Properties

An architectural construct that is arranged in parallel layers may be configured to load a substance into zones between the layers. A molecule of a substance is loaded between parallel layers when it is adsorbed onto the surface of a layer or absorbed into the zones between the layers. For example, referring back to FIG. 3, the architectural construct 300 may load molecules of a substance presented at an inside edge 340 of the layers into the zones 330 between the layers. The support tube 310 may supply the substance through perforations 350.

A number of factors affect whether an architectural construct will load molecules of a substance. In some implementations, the architectural construct is configured to transfer heat away from the zones from which a molecule is loaded. When an architectural construct is cooled, it may load molecules faster or it may load molecules that it was unable to load when it was hotter. Similarly, an architectural construct may be unloaded by transferring heat to the construct or through the construct to reactants or products. In some implementations, an architectural construct is configured to load molecules at a faster rate or at a higher density when an electric charge is applied to the construct. For example, graphene, graphite, and doped boron nitride are electrically conductive. An architectural construct composed of these materials may be configured to load molecules at a higher rate when an electric charge is applied to its layers. Additionally, as mentioned above, in some implementations, an architectural construct can be configured to acoustically resonate at a particular resonant frequency. An architectural construct may be configured to resonate at a specific frequency so that particular molecules proximate to the construct are oriented favorably for loading into the zones between the layers.

In some implementations, an architectural construct is configured to load or unload a substance when radiant energy is directed at the construct. For example, referring to FIG. 3, the distance 320 between each of the parallel layers of the construct 300 may be selected so that the architectural construct absorbs infrared, acoustic, visible or UV waves, causing the layers to heat up and load or unload molecules of a substance that it has loaded. As discussed above, in some implementations, a catalyst can be applied to selected regions such as the outside edges of the layers to facilitate the loading of substances into the zones between the layers.

In some implementations, an architectural construct is configured to selectively load a particular molecule or molecules (e.g., by loading a first molecule and refraining from loading a second molecule). For example, referring again to FIG. 5, the first set 510 of layers may be configured so that they are a particular distance apart that facilitates the selective loading of a first molecule and not a second molecule. Similarly, the second set 520 of layers may be configured so that they are a particular distance apart to facilitate the loading of a third molecule but not the second molecule. Surface tension at the edges of the layers may also be altered or designed to also affect whether a molecule is loaded into an architectural construct. For example, if the first set 510 of layers has already loaded molecules of a first substance, surface tension at the inside edges of the first set 510 of layers where molecules of the substance are loaded from may prevent the first set 510 of layers from loading molecules of the second substance but allow the first set 510 of layers to continue to load molecules of the first substance.

Polarized conformal Raman spectroscopy may be utilized to map locally modified zones of architectural construct. This enables zone-specific adjustments to control heat transfer, polarization, modulus of elasticity, and many other chemical, physical, electrical and mechanical capabilities.

Figure 10:
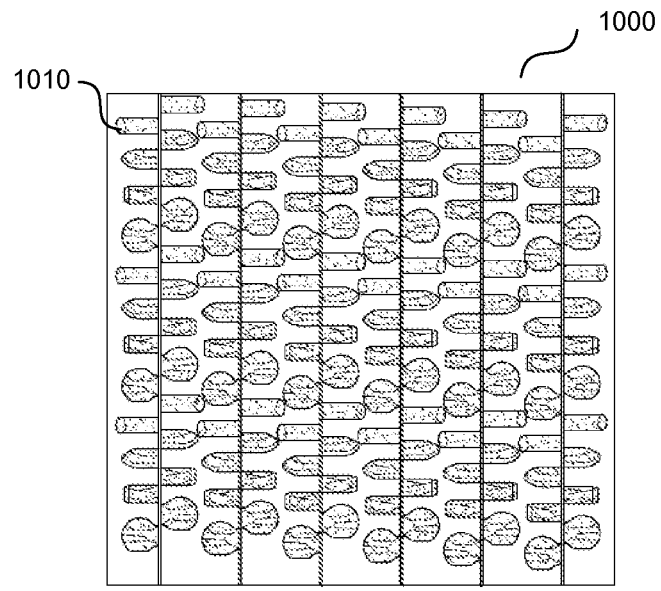
FIG. 10 is a side view of an architectural construct configured as parallel layers.

In some implementations, an architectural construct includes surface structures configured on its surfaces that facilitate in the loading and unloading of substances into and out of the construct. Surface structures can be epitaxially oriented by the lattice structure of a layer to which they are applied. In some embodiments, they are formed by dehydrogenating a gas on the surface of the layers. In other embodiments, they are coated on a layer before adjacent layers are configured on the construct. FIG. 10 shows an architectural construct 1000 that includes parallel layers that have surface structures 1010 configured thereon. The surface structures 1010 include nano-tubes, nano-scrolls, rods, and other structures.

Surface structures can enable an architectural construct to load more of a substance or load a substance at a faster rate. For example, a nano-flower structure can absorb molecules of a substance into an area within the structure and adsorb molecules of the substance on its surface. In some embodiments, the surface structures enable the architectural construct to load a particular compound of a substance. In some embodiments, the surface structures enable the architectural construct to load and/or unload molecules of a substance more rapidly. In some embodiments, a particular type of surface structure is preferred over another surface structure. For example, in some embodiments, a nano-scroll may be preferred over a nano-tube. The nano-scroll may be able to load and unload molecules of a substance more quickly than a nano-tube can because the nano-scroll can load and unload layers of multiple molecules of a substance at the same time while a nano-tube can only load or unload through a small area at the tube ends along the axis. In some embodiments, a first type of surface structure loads a first compound and a second type of surface structure loads a second compound. In some embodiments, surface structures are composed of material that is electrically conductive and/or has a high availability for thermal transfer. In some embodiments, surface structures are composed of at least one of carbon, boron, nitrogen, silicon, sulfur, transition metals, mica (e.g., grown to a particular size), and various carbides or borides and such structures may be compounded, doped and/or oriented to perform electrical, thermal, and chemical functions to meet the design variations disclosed.

Figure 11:
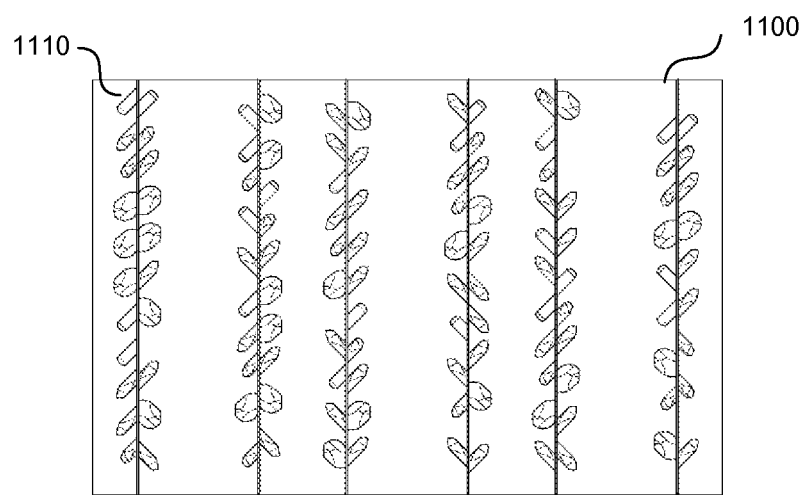
FIG. 11 is another side view of an architectural construct configured as parallel layers.

As is shown in FIG. 10, in some embodiments, surface structures are oriented perpendicular to the surfaces of the architectural construct. In other embodiments, at least some of the surface structures are not oriented perpendicular to the surface that they are applied on. In FIG. 11, surface structures 1110 are oriented at different angles from the surfaces of an architectural construct 1100 than 90-degrees. A surface structure may be oriented at a particular angle to increase the surface area of the surface structure, to increase the rate that molecules are loaded by the surface structure, to increase a loading density of the surface structure, to preferentially load a molecule of a particular compound, or for another reason. Surface structures can be configured, including inclination at a particular angle, by grinding, lapping, laser planning, and various other shaping techniques.

In some implementations, surface structures are configured on an architectural construct and are composed of one or more different materials than the construct. In FIG. 10, for example, the layers of the architectural construct 1000 may be composed of graphene and the surface structures 1010 may be composed of diamond-like structures or boron nitride. The surface structures can be composed of other materials, such as boron hydride, diborane ($B_2H_6$), sodium aluminum hydride, $MgH_2$, LiH, titanium hydride, and/or another metal hydride or metallic catalyst, non-metal or a compound.

Further Implementations

An architectural construct can be designed at a macro level to utilize one or more of the properties discussed above to facilitate micro-processing on a nano-scale. Among the applications for which architectural constructs are useful include as a charge processor, optical information storage and/or processor, a molecular processor, and a bio processor.

An architectural construct configured as a charge processor can be used to build microcircuits, detect the presence of a particular atom or molecule in an environment, or achieve another result. In some implementations, an architectural construct configured as a charge processor forms an electrical circuit. For example, parallel layers of graphene, like those shown in FIG. 4, can be spaced apart by dielectric materials so that the architectural construct stores an electric charge and functions like a capacitor. In some implementations, an architectural construct, like the architectural construct 400 shown in FIG. 4, is configured as a high-temperature capacitor by isolating parallel layers of the construct with a ceramic. In some implementations, an architectural construct, like the architectural construct 400 shown in FIG. 4, is configured as a low-temperature capacitor by isolating parallel layers with a polymer. In some implementations, an architectural construct is configured for processing ions. For example, the architectural construct 400 can be configured with a semipermeable membrane covering certain zones between the layers of the construct. The semi-permeable membrane allows particular ions to penetrate the membrane and enter the architectural construct where they are detected for a particular purpose. In some implementations, an architectural construct is configured as a solid-state transformer.

An architectural construct can also be configured as a molecular processor. As discussed above, in some implementations, material from the architectural construct participates in a chemical reaction. Additionally, in some implementations, an architectural construct can transform electromagnetic waves at a molecular level. For example, an architectural construct can be configured to transform an input such as 100 BTU of white light into an output such as 75 BTU of red and/or blue light. The white light is wave-shifted by chemically resonating the white light to transform it into other frequencies such as blue, green, and red light frequencies. For example, the architectural construct 400 shown in FIG. 4 can be composed of carbon with selected zones converted to a solid solution or compound such as a carbide with reactants such as boron, titanium, iron, chromium, molybdenum, tungsten, and/or silicon, and the construct can be configured so that the layers are oriented to shift white light into desired wavelengths such as red and/or blue light and/or infrared frequencies.

An architectural construct configured as a bio processor may be used to create enzymes, carbohydrates, lipids, or other substances. In some implementations, an architectural construct is configured as parallel layers, and it removes a product of a biochemical reaction from a reaction zone so that the biochemical reaction can continue. For example, the architectural construct 300 shown in FIG. 3 may be configured to load a toxic substance, like chlorine, carbon monoxide, oxides of nitrogen or an alcohol, from a reaction zone within the support tube 310. By removing the toxic substance, a microbe involved in the biochemical reaction will not be inhibited or killed and the biochemical reaction can continue unabated. In other implementations, an architectural construct can be configured to remove and/or protect and/or orient and present a useful product such as hydrogenase of a biochemical process or reaction from a reaction site without having to interrupt the reaction. In another example, the support tube 310 within the architectural construct 300 shown in FIG. 3 may house a biochemical reaction that produces a useful lipid, which is loaded into the zones 330 between the layers of the construct and unloaded on the outside edges of the zones. Therefore, the biochemical reaction can continue while the useful product is removed.

From the foregoing, it will be appreciated that specific embodiments of the invention have been described herein for purposes of illustration but that various modifications may be made without deviating from the spirit and scope of the invention. Accordingly, the invention is not limited except as by the appended claims.

To the extent not previously incorporated herein by reference, the present application incorporates by reference in their entirety the subject matter of each of the following materials: U.S. patent application Ser. No. 08/921,134, filed on Aug. 29, 1997 and titled COMPACT FLUID STORAGE SYSTEM; U.S. patent application Ser. No. 09/370,431, filed on Aug. 9, 1999 and titled COMPACT FLUID STORAGE SYSTEM; and U.S. patent application Ser. No. 12/857,461, filed on Aug. 16, 2010 and titled INTERNALLY REINFORCED STRUCTURAL COMPOSITES AND ASSOCIATED METHODS OF MANUFACTURING.

Methods of Production

Techniques, methods, materials, apparatuses and systems are described for producing, fabricating, and manufacturing an architectural construct. The described techniques, methods, materials, apparatuses and systems can create an architectural construct to be utilized in a variety of implementations so as to exploit its useful properties. Using the described processes of fabrication, an architectural construct can be produced to be implemented as a substrate, sacrificial construct, carrier, filter, sensor, additive, and catalyst for other molecules, compounds, and substances, as well as a means to store energy and generate power. It can be configured to have specific properties, such as a specific density, electrical conductivity, magnetic characteristic, specific heat, optical characteristic, modulus of elasticity, and/or section modulus.

Architectural constructs can be produced, fabricated, and manufactured on a nano-, micro-, and macro-size scale. In addition to size, other design factors including composition, structure, layer orientation, dopants, etc., can be determined before and during the fabrication of an architectural construct, in order to engineer it with desired properties and functionalities. Architectural constructs can be produced for use in a variety of industries including building materials and construction, durable goods, clean energy, filter technology, fuel technology, production of chemicals, pharmaceuticals, nanomaterials, and biotechnology, among many others.

In some embodiments, a method to manufacture architectural constructs can be performed to produce nanometer sized architectural constructs. For example, a single atom-thick layer of material (such as carbon or boron nitride) can be deposited on a substrate, and by giving the deposited material energy (such as heat energy), the material can find its lowest energy and self-align forming a single organized layer. The length and width of the layer can be produced to range from small, such as an area in the $nm^2$ or $\mu m^2$, to large, such as a square millimeter, centimeter, meter, or even larger area. The process can then be repeated to add another layer or layers of material on top of it to form a matrix characterization of layers. These layers, however, are not limited to interconnecting through atomic bonds but may also be controlled by secondary forces such as Van der Waals bonds. The process can then be stopped, in which an architectural construct of the deposited material has been created, but the method can also be continued by again giving the deposited layers energy and introducing precursors, such as e.g., a fluid or a gas. The gas can flow between the layers, and when the energy is removed, the gas can be held between the layers. The type of gas introduced can affect and change how the gas is held in the formed self-organized layers. For example, atomic bonds can be formed with the gas when the gas is a carbide former in a carbon-based architectural construct; or the carbide former gas can substitute into a two dimensional layer. In another example, when the gas is a noble gas, bonding can be much weaker, such as Van der Waals bonds. The type of gas can be used to engineer the properties of an architectural construct. Another way to manipulate engineering properties of an architectural construct is to introduce precursors (e.g., dopants) into the plane with elements, compounds, or substances that can change its orientation or magnetism including magnetic information storage. Additionally, the additions of precursors can be used to influence the spacing and exfoliation of the layers, which can impact the engineered properties of the architectural construct and the size. Spacing, orientation, and exfoliation can further affect the desired engineered properties of architectural constructs. Layers can be spaced, oriented, and exfoliated by the addition of pressure, heat, and/or precursors (such as catalysts). Alterations in applied pressure, heat, catalysts, or various combinations of these processes can exfoliate layers with variable spacing and/or orientations.

Depending on the desired properties of the end product of the architectural construct, the formed layers with the incorporated precursors can be cleaved (e.g., cut up into smaller areas or larger areas). The cleaved architectural construct can be reinforced by at least one of adding a carbon fiber to wrap (e.g., fix or stabilize) the layers, doping the edge atoms of the layers to induce the formation of atomic bonds, and connecting the two dimensional planes by scroll deformation. In one aspect, reinforcement of an architectural construct can employ some of the atoms in place within the layers to connect the planes together. In a carbon-based architectural construct, an electron beam (e.g., 400 KeV) can allow a localized diamond structure to grow between the layers; also, other similar processes with a laser or other radiation methods can be employed to facilitate localized diamond growth between the layers in carbon-based architectural constructs. Another example to reinforce an architectural construct can include formation of scroll deformation(s) by use of an outside energy source to interconnect the layers. A scroll is a type of deformation that can be caused by a different atom being substituted in a plane of all similar atoms. By intentionally doping localized areas of the planes to create scrolls, the substituted atoms can be arranged in a line that can cause the plane to bend or fold crease. If the substituted atoms are arranged in more circular pattern, the plane can take on a three dimensional shape, e.g., by bending the bonds to and sheet toward another sheet, and the atoms from the bent sheet bonding to another sheet.

Figure 12A:
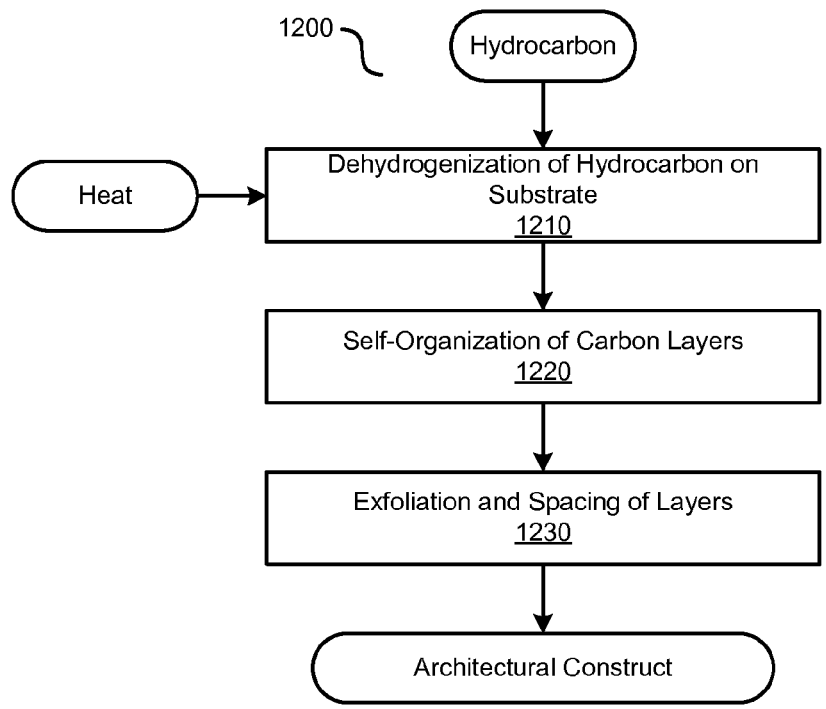
FIG. 12A shows an exemplary process of fabricating an architectural construct using hydrocarbon.

FIG. 12A shows a process flow diagram of an exemplary process 1200 to fabricate an architectural construct of carbon. Process 1200 can include a process 1210 to dehydrogenate a purified hydrocarbon by applying heat through a substrate. Process 1200 can also include a process 1220 to facilitate self-organization of the deposited carbon to form a matrix characterization of layers over the substrate. Process 1200 can also include a process 1230 to exfoliate and space the layers in the formation of an architectural construct.

A variety of carbon sources can be collected and used to produce a carbon-based architectural construct, such as carbohydrates (like cellulose, lignocelluloses, etc.) and hydrocarbons, which can be partially dissociated or destructively processed to release carbon to a feedstock, such as hydrocarbon ($C_xH_y$) in a purified form. Process 1210 can be implemented to dehydrogenate the suitable purified hydrocarbon compound, for example a paraffinic gas such as methane, over a substrate by applying heat to a temperature approaching the decomposition temperature of the carbon-donor compound through the substrate. Systems to supply heat can include solar trapping and/or concentrator systems and counter-current heat exchange systems. Additionally, heat can be incorporated from waste heat systems (e.g., engine exhaust) or renewable energy sources that can include at least one of wind, hydro, biomass, solar, tidal, and geothermal energy. Hydrocarbons used in this process can also include other paraffins and olefins, such as methane, ethane, ethylene, propane, propylene, butane, butylene, and other larger molecular weight paraffins and olefins. Briefly, Equation (3) below shows an exemplary general process for dehydrogenation of a paraffinic hydrocarbon to dissociate and produce carbon (C) and hydrogen gas ($H_2$). Equation (4) below shows the exemplary process for dehydrogenation of methane to produce C and $H_2$.

$$C_xH_y + HEAT \rightarrow xC + 0.5yH_2 \quad (3)$$

$$CH_4 + HEAT \rightarrow C + 2H_2 \quad (4)$$

The dehydrogenation process can be performed in a chamber or environment where the reaction steps are protected against discrepant reactions and processes. A higher anaerobic temperature of deposition can result in a faster rate of solid deposit. Pressurization of the carbon donor gas can expedite the rate of carbon formed on the substrate. Lower pressures can favor decomposition of the purified hydrocarbon compound and can produce higher $H_2$-to-hydrocarbon ratios. Exemplary substrate materials used in this process can include pyrolytic graphite and boron nitride (including hot-pressed zone refined and recrystallized boron nitride). Selection of the substrate can influence the growth pattern of the self-organizing layers.

The deposited carbon can self-organize to form a matrix characterization of crystallized carbon in a series of layers over the substrate (process 1220). The deposited carbon can find its lowest energy and self-align forming a single organized layer, and further layers of deposited carbon can self-organize to form many layers of a matrix characterization. The formed layers of a matrix characterization of carbon can be graphene, for example. A schematic of an exemplary layer of a matrix characterization 100 of crystallized carbon can be seen in FIG. 1A. The self-organization of carbon process can be modified to form layers of a matrix characterization of crystallized carbon of different thicknesses and orientations of layers. For example, revisiting FIGS. 1B and 1C, carbon atoms can self-organize to form a matrix characterization such that a first layer and a second layer are aligned (as seen in FIG. 1A), partially offset from alignment (as seen in FIG. 1B), and fully offset from alignment (as seen in FIG. 1C).

Figure 12B:
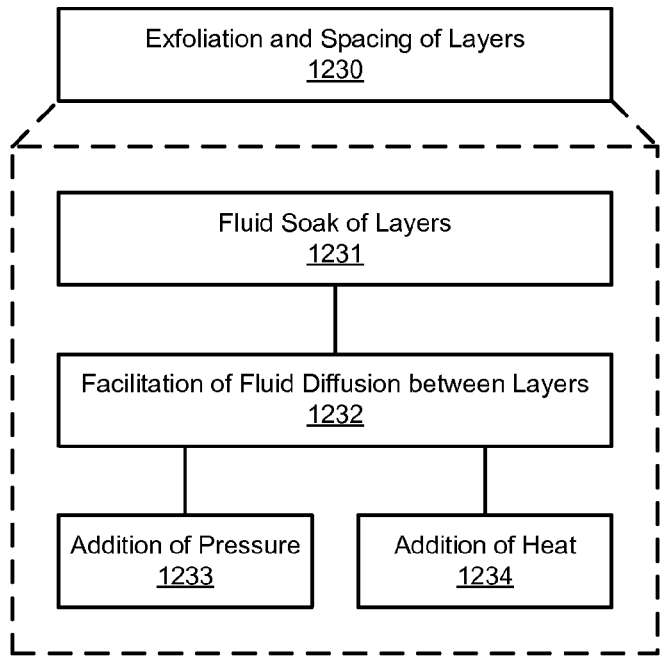
FIG. 12B shows an exemplary process of exfoliation and spacing of layers in the process of fabricating an architectural construct.

Process 1230 to exfoliate and space layers formed by self-organization of carbon can be exfoliated and spaced using heat or other methods described here. FIG. 12B shows an exemplary process of the process 1230 for exfoliation and spacing of the self-organized layers using a fluid substance that can exfoliate the layers of a matrix characterization of crystallized carbon. In this exemplary process, the self-organized layers receive exfoliate precursors by doping procedures, zone refinement, and/or can be warm-soaked in a fluid substance (process 1231), such as the produced hydrogen from process 1210. Diffusion of the fluid substance between the layers of the matrix characterization can be facilitated until a uniform or non-uniform concentration is reached (process 1232). For example, to optimize diffusion of the fluid substance between the layers of a matrix characterization of carbon, pressure can be suddenly released from the system encasing the formed layers, which can cause the diffused fluid to move into areas where the packing is least dense and form gaseous layers. The layers can be exfoliated by the addition of pressure (process 1233) and by the addition of heat (process 1234). Alterations in applied pressure, heat, or both in processes 1233 and 1234 can exfoliate layers with variable spacings. The exfoliated layers can be oriented in a position with respect to one another, e.g., parallel to any other exfoliated layer and offset and/or rotated (as seen in FIGS. 1A-C). A homogeneous fluid substance diffused into the self-organized layers at a uniform concentration can exfoliate the layers with uniform thicknesses and spacing. In an exemplary matrix characterization of carbon graphene, exfoliation of layers can occur along each of the 0001 planes.

Figure 12C:
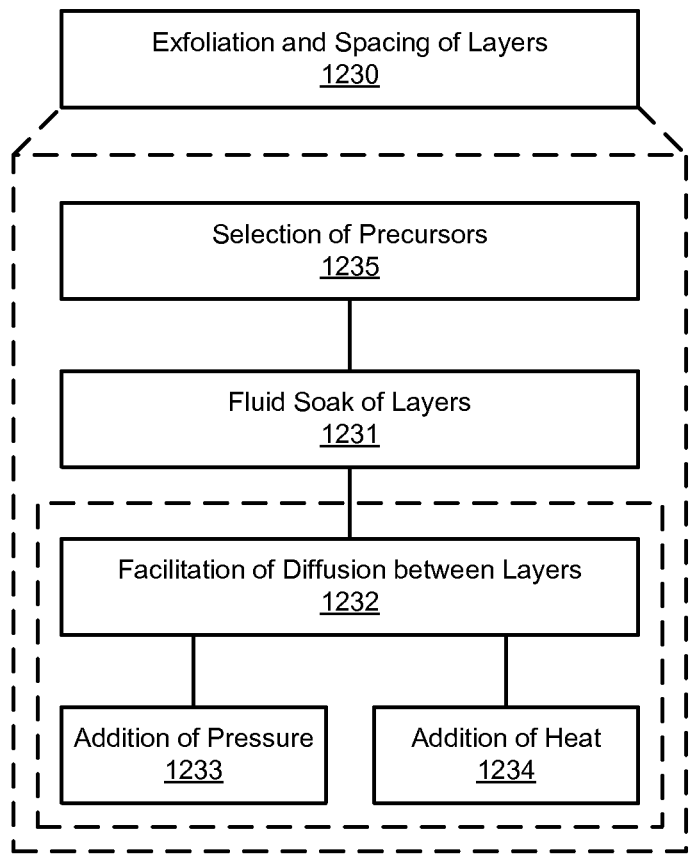
FIG. 12C shows another exemplary process of exfoliation and spacing of layers using selected precursors in the process of fabricating an architectural construct.

Spacing of exfoliated layers can be configured using selected precursors during process 1230, as shown in FIG. 12C. Selected precursors can be used along with suitable arrangements such as zone refinement and heat treatments to provide sufficient time at selected temperatures to achieve sufficient transformations to exfoliate or enable exfoliation of the layers of a matrix characterization of crystallized carbon with variable layer spacing (of smaller and/or larger distances from one another). Selected precursors, also referred to as spacers, can be selected from a variety of materials (process 1235); one such example can include a fluid substance. In one aspect, particular fluid spacers can be selected (process 1235) and be used to warm-soak the self-organized layers (process 1231) in a manner in which the distance of layer separation can be controlled by controlling the amount and type of fluid substance that enters the crystal and the temperature at the start of expansion. For example, spacing with selected fluid precursors to create additional separation of layers can include selecting successively larger paraffin molecules, such as methane, ethane, propane, and butane to achieve variable spacing. A larger molecule can achieve a relatively larger spacing compared to a smaller molecule. Additionally, processes 1232 and 1233 and/or 1234 can be employed along with regional modifications by inductive coupling, laser, electron-beam or another type of radiant energy transfer for zone refinement to facilitate diffusion of the selected fluid precursor(s) to control uniform or non-uniform concentrations of the spacers between the layers (process 1232) and further control variable spacing during exfoliation of layers with the addition of pressure (process 1233) and heat (process 1234).

Still referring to FIG. 12C, spacing of exfoliated layers can also be configured using selected precursors during process 1230 that include selecting other classes of precursors (spacers) in process 1235 and implementing processes 1232 and 1233 and/or 1234. In one aspect, particular distances between the exfoliated layers can be achieved by depositing other classes of selected precursors (spacers) during processes 1233 and/or 1234. For example, other selected precursors can include titanium, titanium hydride, iron, nickel, cobalt, boron, nitrogen, carbon, hydrocarbon, and silicon along with preparations of such precursors such as carbonyls (e.g., iron pentacarbonyl). Also, other selected precursors can include trace crystal modifiers, such as neon, argon, or helium, which can be added at the time of a layer's formation through localized zone refinement and/or more general heat treatment that can move the structure to a particular orientation, or through torque of the matrix characterization of a crystal during exfoliation.

Additionally, the layers of a matrix characterization of crystallized carbon may be coated with selected precursors that catalyze the warm-soaking process 1231 and diffusion process 1232 by helping the fluid enter the crystal. These layer-coating processes including zone refinement and/or more general heat treatment with selected precursors can also control the depth to which the fluid diffuses into the crystal, which can allow layers that are multiple-atoms thick to be exfoliated from the crystal. Examples of layer-coating selected precursors can include platinum metal, rare earth metals, palladium-silver alloys, titanium and alloys of iron-titanium, iron-titanium-copper, and iron-titanium-copper-rare earth metals. A thin coating of a layer-coating selected precursor or combination of layer-coating selected precursors can be applied by vapor deposition, sputtering, or electroplating techniques. The layer-coating selected precursors can be removed after each use and reused on another batch or series of layers of a matrix characterization after it has allowed the diffusion of fluid into the crystal. Depending upon analysis of the energy requirements and recovery efficiency zone refinement to improve such removal and recovery and may be selected compared to more general heat treatment and chemical removal procedures. In some cases, selected precursors can include dopants or impurities that can be introduced into the crystal at a particular depth by techniques such as zone refinement in which one or more types of energy such as directed laser, inductive, electron beam and other radiation frequencies are utilized to encourage the fluid to diffuse to that depth so that layers that are multiple-atoms thick can be exfoliated from the crystal. Additionally, these type of dopant or impurity selected precursors can be localized on the edges of the produced architectural construct using electron beam or laser deposition, in which localization can greatly reduce the amount of dopants or impurities and increase its specialization.

Figure 12D:
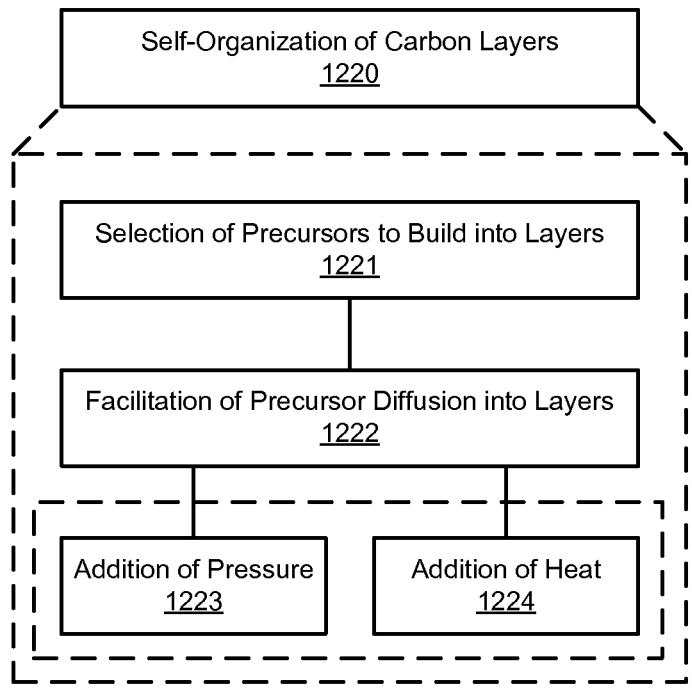
FIG. 12D shows an exemplary process of self-organization of layers using selected precursors in the process of fabricating an architectural construct.

Selected precursors can also be built into the building blocks of the matrix characterization during process 1220, as shown in FIG. 12D. For example, selected precursors to be built into the matrix characterization diffusion (also referred to as build precursors) can be selected and exposed to the matrix characterization in process 1221. Deposition of build precursors between the layers of the matrix characterization can be facilitated by diffusion until a uniform or non-uniform concentration is reached, exemplified in process 1222. Additionally, processes 1223 and/or 1224 can be employed to aid process 1222 to facilitate diffusion of the selected build precursor(s) with the addition of pressure (process 1223) and heat (process 1224).

In some implementations of process 1200, one or more holes may be bored in a matrix characterization of crystallized carbon before exfoliation, which can be used to accommodate a support structure (exemplified in FIG. 3 as a support tube 310 of an architectural construct 300). A support structure can include fibers, nanotubes, and nanoscrolls in some examples. A support structure can be configured within a matrix characterization to support the desired architectural construct. Configuration of a support structure within a matrix characterization can occur during process 1200 before the process 1230 to exfoliate and space layers. Or, a support structure can be configured within a matrix characterization after the exfoliation process 1230.

In some cases, a support structure may also be used to fix the layers of an architectural construct at a particular distance apart from one another. Therefore, a support structure can also be used as a stabilizer to stabilize the architectural construct. In some implementations of process 1200, a support structure can be configured along the edges of an architectural construct's layers (e.g., as a casing for an architectural construct that is comprised of parallel layers) after completion of the architectural construct. For example, carbon fiber (also referred to as a wrap) can be used to fix or stabilize ('pin') the layers to prevent their collapse, e.g., prevent the layers from shearing or shear sliding. Boron nitride fiber wraps can also be used to fix the layers of an architectural construct. Three wraps can be used to stabilize the architectural construct from shearing in any direction. Configuration of a stabilizing support structure along an edge or edges of an architectural construct can occur after process 1200.

Figure 12E:
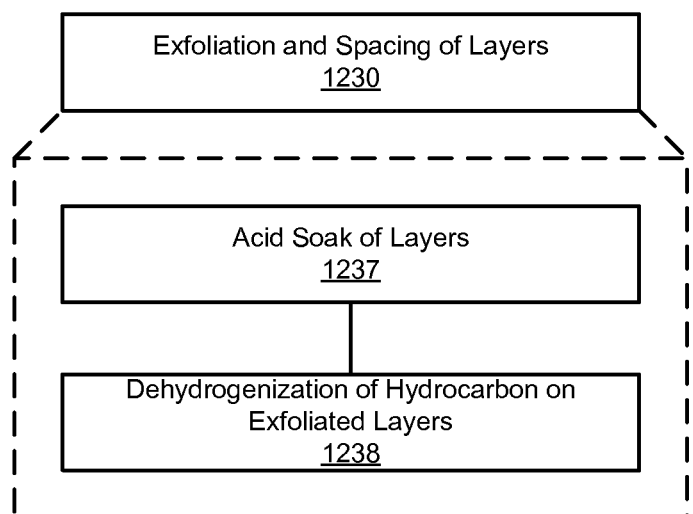
FIG. 12E shows another exemplary process of exfoliation and spacing of layers using acid in the process of fabricating an architectural construct.

FIG. 12E shows another exemplary method of the process 1230 for exfoliation and spacing of the self-organized layers using an acid treatment approach. Process 1237 can involve soaking the layers formed by self-organization of carbon with an acid, such as sulfuric acid or oleums. Subsequently, any damage to the exfoliated layers can be repaired by reintroducing and dehydrogenating a purified hydrocarbon, such as methane, to the exfoliated layers (process 1238). One advantage of utilizing this method of process 1230 can include larger spacing between exfoliated layers.

Another exemplary method to perform the exfoliation and spacing of layers (process 1230) can involve electrically charging or inductively magnetizing each exfoliated layer and electrically or magnetically force the layers apart from one another.

Figure 13:
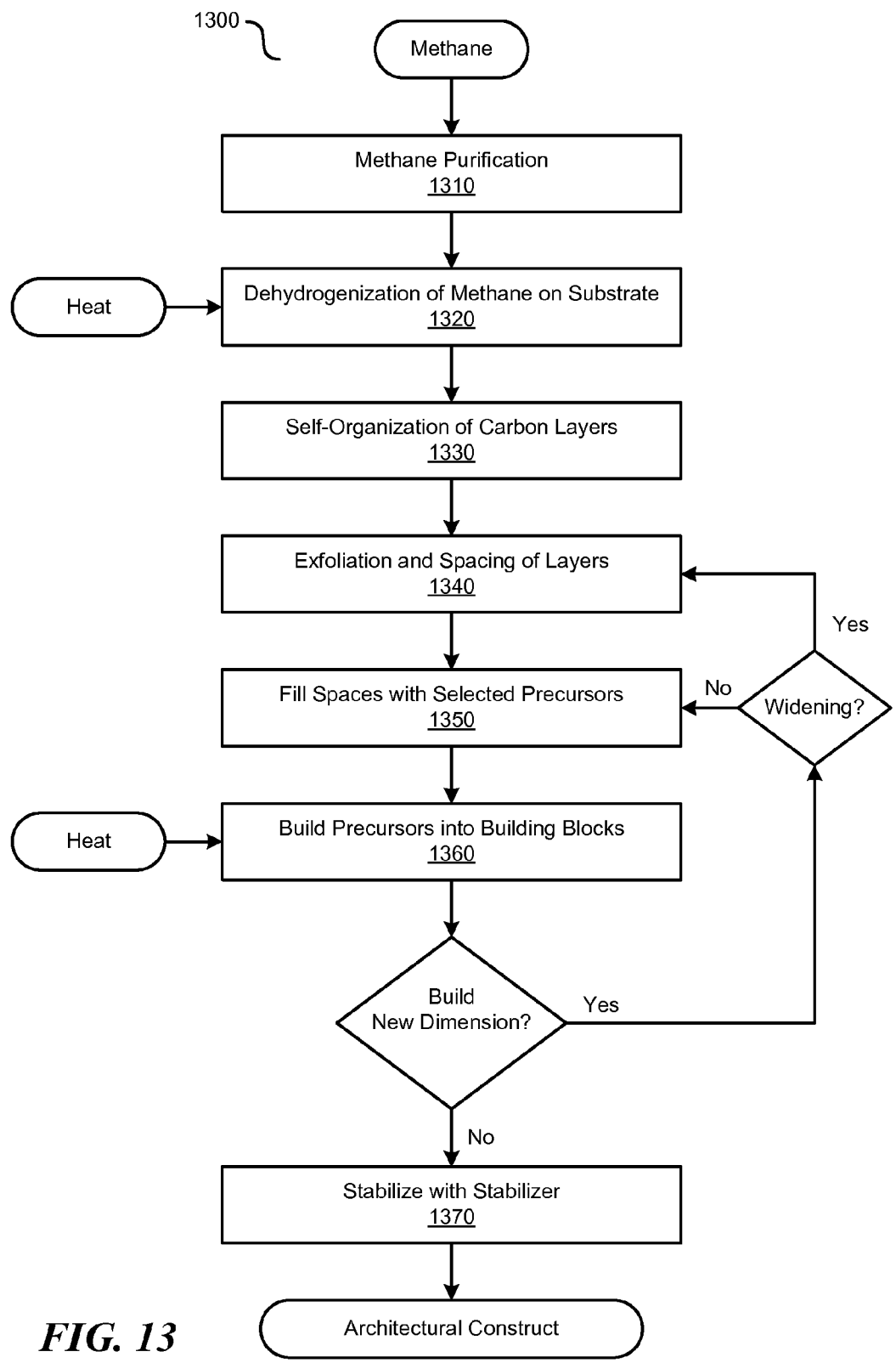
FIG. 13 is an exemplary method of fabricating an architectural construct using purified methane.

FIG. 13 shows a process flow diagram of an exemplary process 1300 to fabricate an architectural construct of carbon using purified methane. Process 1300 can include a process 1310 to purify methane from an impure carbon source, such as a hydrocarbon or carbohydrate taken from a variety of sources, such as a waste stream. For example, an impure carbon source can be processed (e.g., dissociated through anaerobic digestive processes) and purified into methane. Processes to purify methane can depend on the types of impurities associated, which can include precipitation through a chemical reaction, diffusion by size, phase change (if impurity is condensable, like water), and filtration by size and/or chemical properties. According to certain embodiments of the disclosure, the process 1310 to purify methane from an impure carbon source can be at least partially made from a system to produce carbon-based durable goods and renewable fuels as disclosed in U.S. patent application Ser. No. 13/027,068, filed on Feb. 14, 2011 and titled "CARBON-BASED DURABLE GOODS AND RENEWABLE FUEL FROM BIOMASS WASTE DISSOCIATION."

Process 1300 can also include a process 1320 to dehydrogenate purified methane by applying heat through a substrate (in a manner similar to process 1210); a process 1330 to facilitate self-organization of the deposited carbon to form a matrix characterization of layers over the substrate (in a manner similar to process 1220); and a process 1340 to exfoliate and space the layers in the formation of an architectural construct (in a manner similar to process 1230). If desired, process 1300 can further include a process 1350 to fill the spaced layers (created in processes 1340) with selected precursors. Also if desired, a process 1360 can build these selected precursors into the matrix characterization of formed and spaced layers by applying heat including application of directed zone refinement by inductive coupling, laser, and/or electron beam delivery. If desired, new dimensions to the architectural construct can be created by filling spaces between layers again with selected precursors (e.g., repeating process 1350) and building selected precursors into the matrix characterization of the formed and spaced layers (e.g., repeating process 1360). Repeated processes involving precursors can be performed with different precursors and selected patterns of relocation activity as may be developed by zone refinement using suitable energy input such as laser, induction, electron beam or focused light of another frequency than the previous iteration, for example. If further widening of the architectural construct is also desired, repetition of process 1340 can be implemented before repeating processes 1350 and 1360 to create new dimensions to the architectural construct. Process 1300 can also include a process 1370 to configure a stabilizing support structure (stabilizer) along an edge or edges of an architectural construct.

In another implementation of process 1300, process 1370 can be implemented between processes 1340 and 1350 instead of after process 1360. In another implementation of process 1300, process 1370 can be implemented both between processes 1340 and 1350 as well as after process 1360. In another implementation of process 1300 to create an architectural construct without stabilization, process 1300 can be implemented without implementing process 1370.

Figure 14:
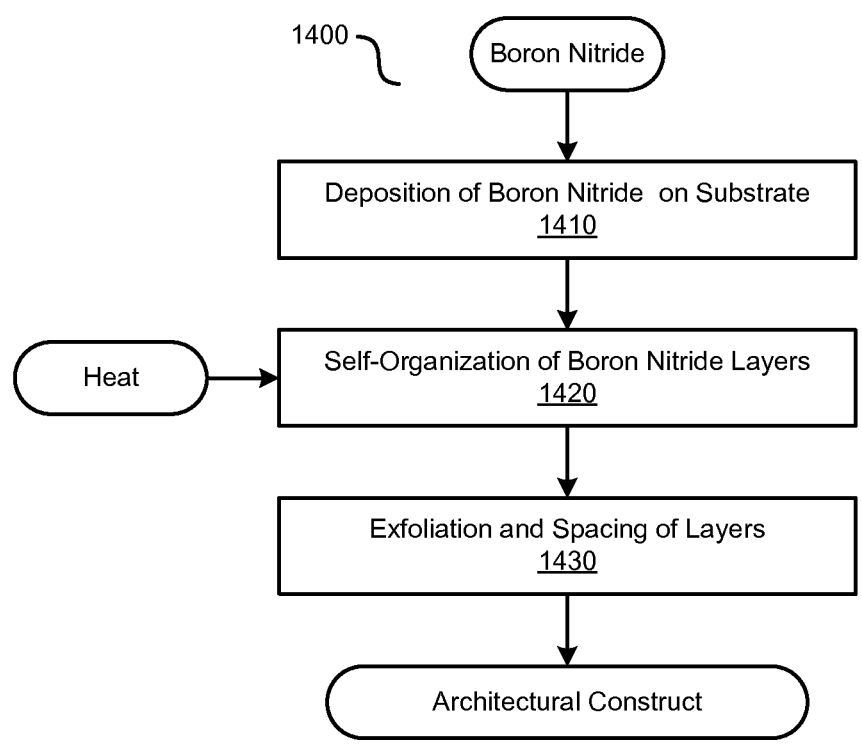
FIG. 14 shows an exemplary process of fabricating an architectural construct using boron nitride.

FIG. 14 shows a process flow diagram of another exemplary process 1400 to fabricate an architectural construct. Process 1400 can include a process 1410 to deposit boron nitride on a substrate through processes such as general heat treatment and/or various types of zone refinements including localized or directed processes as previously disclosed. Process 1400 can also include a process 1420 to facilitate self-organization of the deposited boron nitride by applying heat through a substrate to form a matrix characterization of boron nitride layers over the substrate. Process 1400 can also include a process 1430 to exfoliate and space the layers in the formation of an architectural construct (in a manner similar to process 1230).

Figure 15:
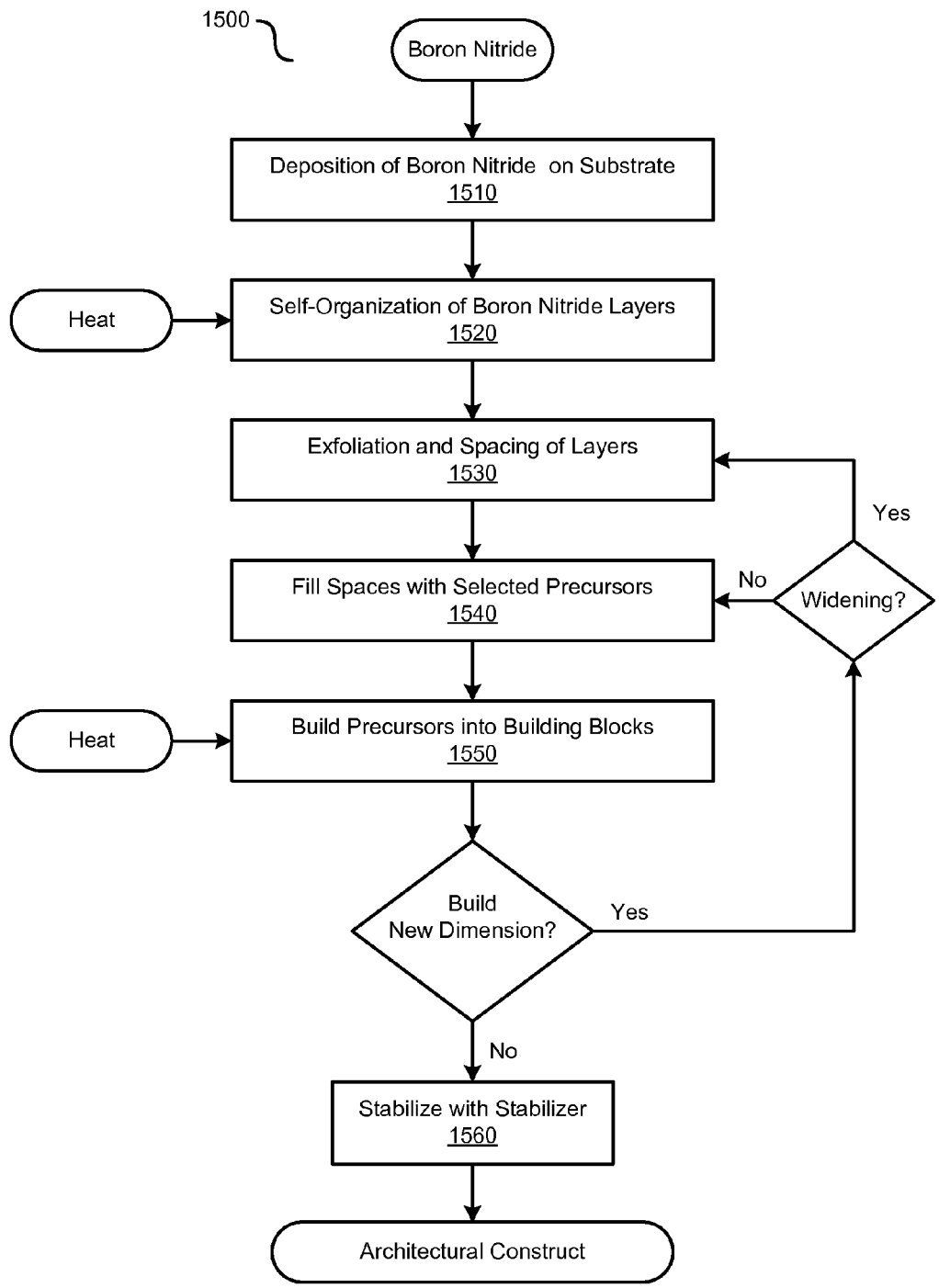
FIG. 15 shows another exemplary method of fabricating an architectural construct using boron nitride.

FIG. 15 shows a process flow diagram of an exemplary process 1500 to fabricate an architectural construct using boron nitride. Process 1500 can include a process 1510 to deposit boron nitride on a substrate; a process 1520 to facilitate self-organization of the deposited boron nitride to form a matrix characterization of layers over the substrate by applying heat through the substrate (in a manner similar to process 1220); and a process 1530 to exfoliate and space the layers in the formation of an architectural construct (in a manner similar to process 1230). If desired, process 1500 can further include a process 1540 to fill the spaced layers (created in processes 1530) with selected precursors. Also if desired, a process 1550 can build these selected precursors into the matrix characterization of formed and spaced layers by applying heat including general heat treatment and/or zone refinement including localized development of chemical and physical properties by laser, electron beam, inductive or focused light. If desired, new dimensions to the architectural construct can be created by filling spaces between layers again with selected precursors (e.g., repeating process 1540) and building selected precursors into the matrix characterization of the formed and spaced layers (e.g., repeating process 1550). If further widening of the architectural construct is also desired, repetition of process 1530 can be implemented before repeating processes 1540 and 1550 to create new dimensions to the architectural construct. Process 1500 can also include a process 1560 to configure a stabilizing support structure (stabilizer) along an edge or edges of an architectural construct.

In another implementation of process 1500, process 1560 can be implemented between processes 1530 and 1540 instead of after process 1550. In another implementation of process 1500, process 1560 can be implemented both between processes 1530 and 1540 as well as after process 1550. In another implementation of process 1500 to create an architectural construct without stabilization, process 1500 can be implemented without implementing process 1560.

Figure 16A:
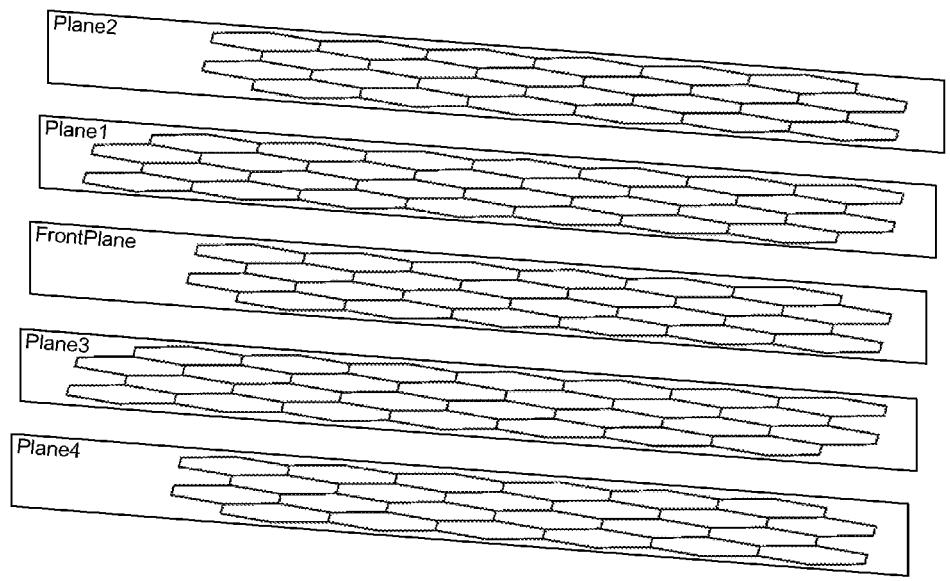
FIG. 16A shows a side view of an exemplary architectural construct with planes of single-atom thick layers.
Figure 16B:
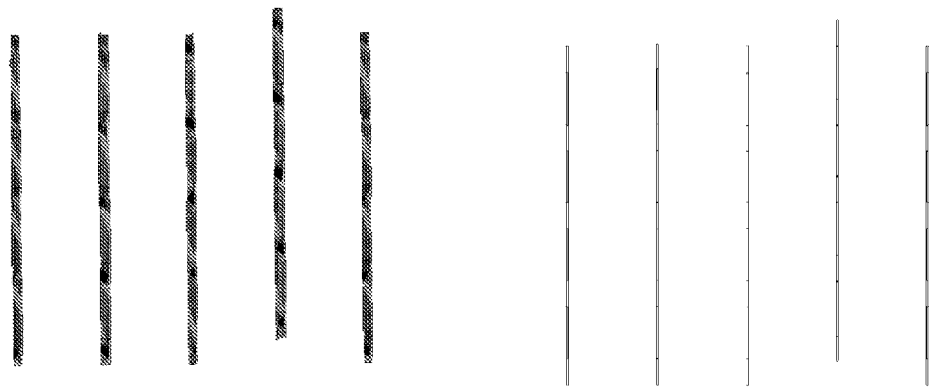
FIG. 16B shows another side view of an exemplary architectural construct with planes of single-atom thick layers.
Figure 16C:
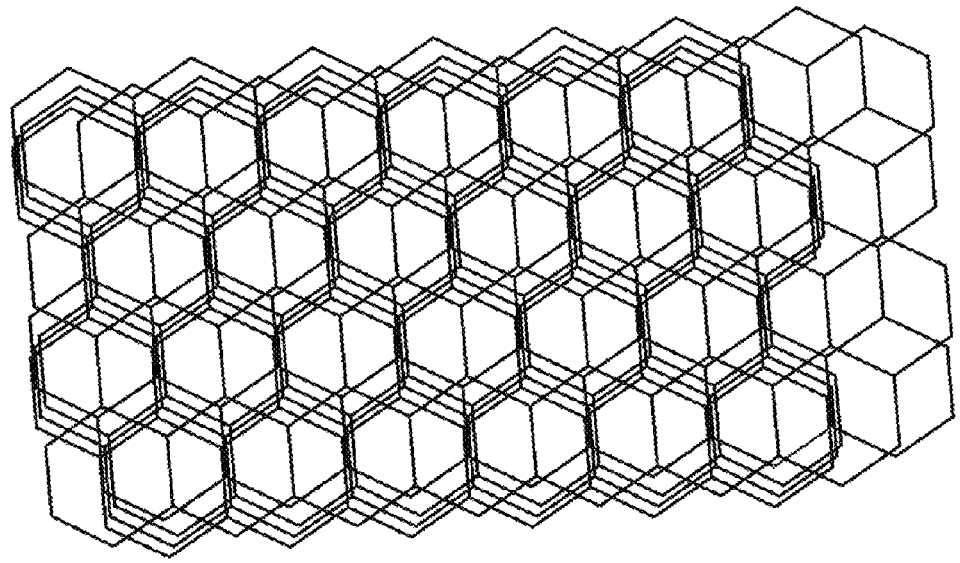
FIG. 16C shows a top view of an exemplary architectural construct with planes of single-atom thick layers.
Figure 16D:
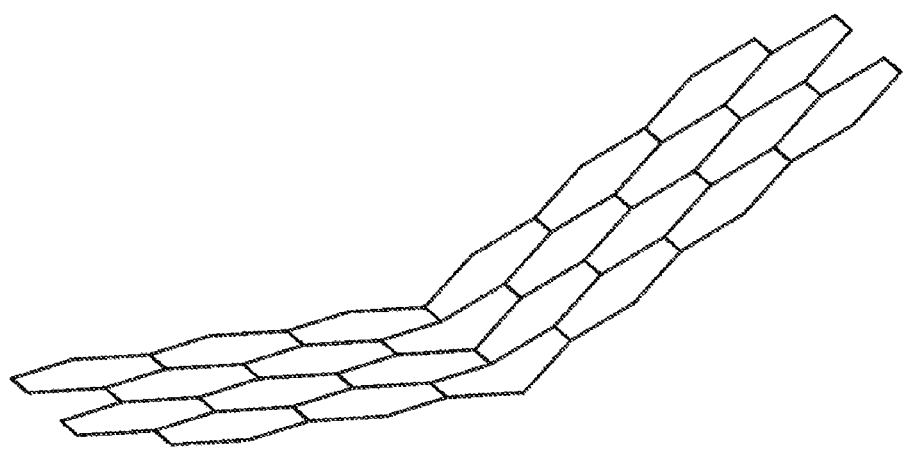
FIG. 16D shows an exemplary plane that exhibits scroll behavior.
Figure 17A:
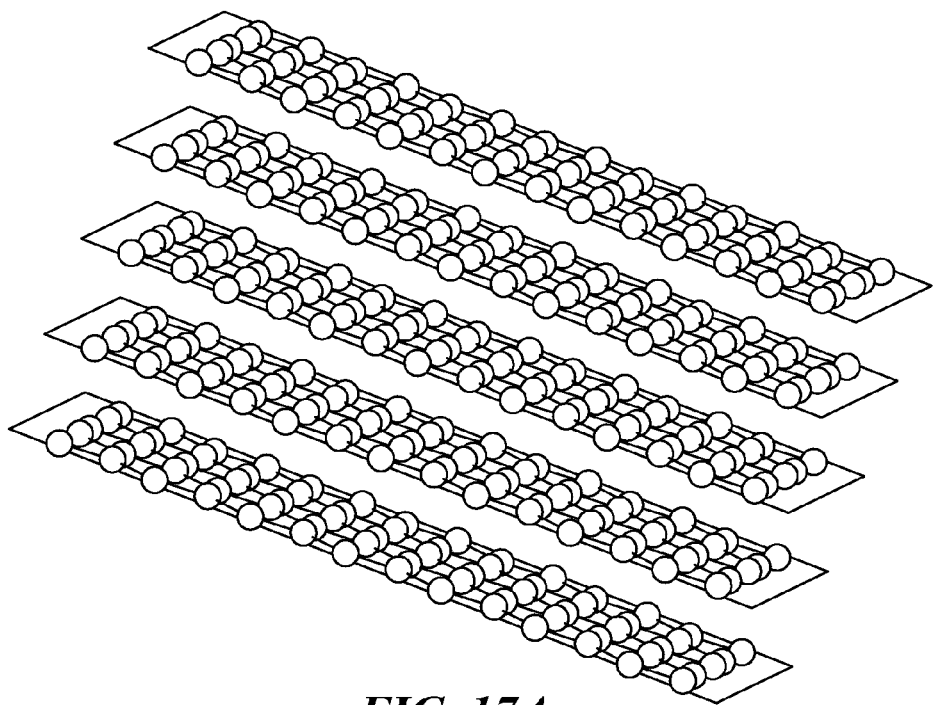
FIG. 17A shows a three dimensional side view of uniformly spaced, parallel layers of an exemplary architectural construct.

The described exemplary processes can be implemented to create architectural constructs with specified functional properties, which can be based on the design factors incorporated into the method(s) to manufacture the architectural construct. Such architectural construct design factors can include its composition, matrix characterization, dopants, edge atoms, surface coatings, and configuration of layers, e.g., number, thickness, orientation, geometry, spacers in between, and spacing distance of layers. For example, FIGS. 16A, 16B, 16C, and 17A show uniformly spaced, parallel layers of an architectural construct, which can be composed of carbon or boron nitride. FIG. 16A shows a side view that exhibits exemplary planes of a single-atom thick matrix characterization layer; FIG. 16B shows the exemplary planes along another side view; FIG. 16C shows the exemplary planes along a top view; and FIGS. 16A-C show the exemplary planes not aligned. FIG. 16D shows one exemplary plane that exhibits a scroll behavior of the plane to bend or fold crease. FIG. 17A shows a three dimensional side view of an exemplary architectural construct.

By configuring the size, quantity, orientation, spacing distance of layers in an architectural construct, new engineered materials can be produced, fabricated, and manufactured on a nano-, micro-, and macro-size scale. In addition to size, other design factors including composition, crystal structure, layer orientation, dopants, etc., can be determined before and during the fabrication of an architectural construct, in order to engineer it with desired properties and functionalities.

Figure 17B:
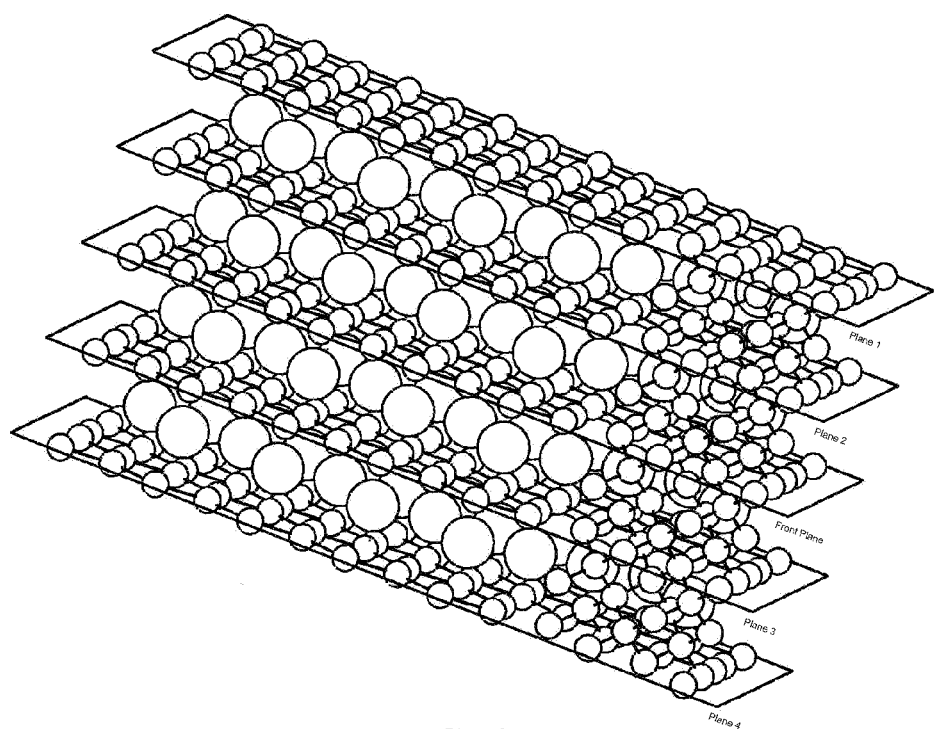
FIG. 17B shows a three dimensional side view of an exemplary architectural construct with gas molecules adsorbed and confined between layers.

In one example, an architectural construct can be used to build new materials by which the architectural construct can bind atoms, molecules, compounds, or substances of a normal, standard, common, rare, and existing material. The bound substance can be of the same or of another material as the material or materials that make up the composition of an architectural construct. An architectural construct can be configured to bind substances through intermolecular attractive forces and exhibit adsorption properties to accumulate gases, liquids, and/or solutes on the surface of the layers, thereby capturing and storing and/or hosting the accumulated substance(s) in specialized zones of the architectural construct. For example, FIG. 17B shows gas molecules that can be adsorbed and confined between layers of an architectural construct. FIG. 17B can be, for example, an architectural construct that is a matrix characterization of crystallized carbon, where the layers of carbon crystal are graphene layers that adsorb and confine a gas, like methane or hydrogen and localized zone refinement by laser, microwave, electron beam, or focused light may be individually or selected in various combinations for energy additions in nano-, micro-, or macro-scale regions.

Figure 18A:
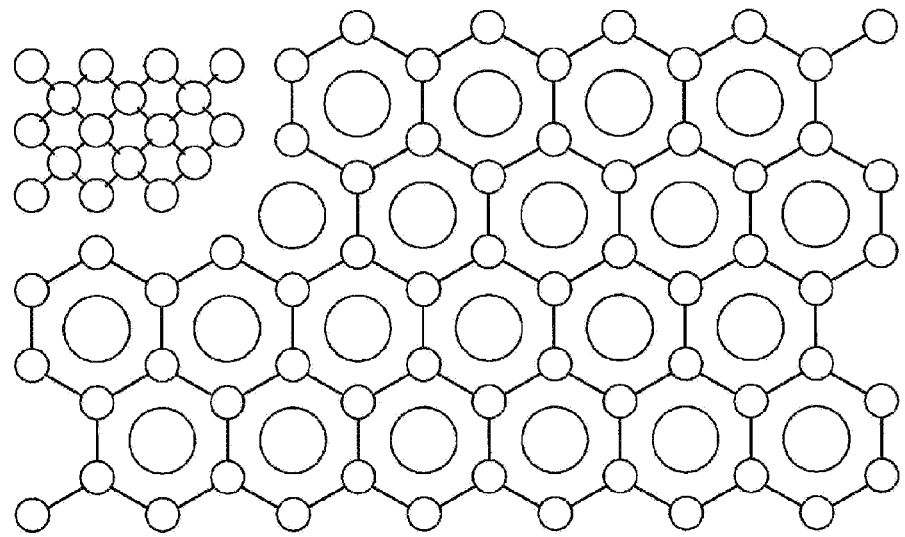
FIG. 18A shows a three dimensional top view of exemplary plane(s) of layer(s) of an architectural construct carrying a substance and self-healing.
Figure 18B:
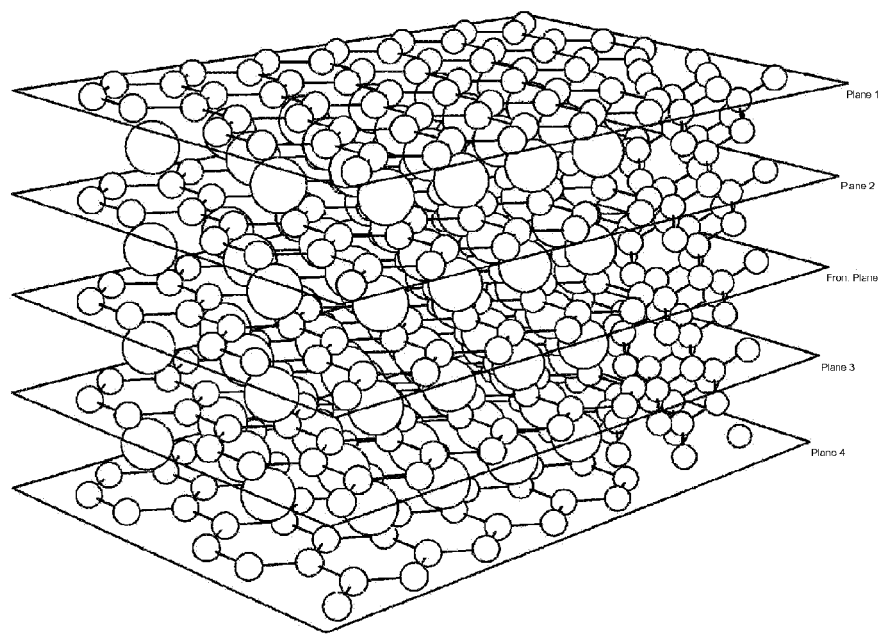
FIG. 18B shows a three dimensional side view of exemplary planes of layers of an architectural construct carrying a substance and self-healing.

In another example, an architectural construct can carry substances by loading and unloading the substances. FIG. 18A shows a three dimensional top view of an exemplary plane (or planes) of a layer (or layers informally aligned) of an architectural construct that can carry a substance, such as a gas, by adsorbing it to the surface of the layer and self heal after the atoms of its constituent structure (and carried substance) are consumed. For example, the architectural construct in FIG. 18A can be composed from carbon and capture and carry methane gas. In this exemplary case, after unloading substances, reacting with other substances, or otherwise being used up, the sacrificed matrix characterization of carbon can be self-healed by self-organization of diamond. FIG. 18B shows a three dimensional side view of an exemplary architectural construct of many parallel oriented layers of the architectural construct featured in FIG. 18A that can carry a substance, sacrifice itself, and self-heal.

An architectural construct can be designed for processing on a nanometer, micrometer, or larger macro-level scale in order to exhibit particular properties for various functionalities and outcomes where the desired implementation exists exclusively on that scale or on more than one scale. Such functionalities can include an engineered material that can be used for thermal blocking and heat tolerance, heat transfer control, heat trigger points, pressure resistance, pressure yielding, pressure trigger points, piezoelectric effects (e.g., charge transfer upon compression of layers), optical transparency-conductivity and opacity (e.g., to certain radiant wavelengths), optical triggers, surface tension attraction and repulsion (e.g., include site receptors and rejecters on the architectural construct), chemically interactive zones or platforms, chemically inert zones or platforms, chemical trigger points, electron transport and electrically conductive purposes, electrically inert-insulative purposes, corrosion resistance, bio-proliferation resistance, chemical degradation purposes (e.g., degrade the structure and functionality of carcinogenic materials), kinetic energy storage and transfer, kinetic energy blocking, tensile strength, hardness, and lower or higher weight and density. Applications of new engineered materials by designed architectural constructs can exploit these functionalities in a variety of systems, such as fuel delivery systems, chemical delivery systems, drainage and irrigation systems, electrical delivery systems, energy harvesting systems, energy storage systems, and energy generation systems. New engineered materials by designed architectural constructs can be used in a variety of building materials and parts, such as car parts, tiles, roofing and flooring materials, fencing, framing members, pallets, and receptacles.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this application. For example, the described techniques, systems and apparatus can be implemented to provide carbon extraction from any hydrogen and carbon containing material. Specific embodiments of the invention have been described herein for purposes of illustration, but various modifications may be made without deviating from the spirit and scope of the invention. Accordingly, the invention is not limited except as by the appended claims.

To the extent not previously incorporated herein by reference, the present application also incorporates by reference in their entirety the subject matter of each of the following materials: U.S. patent application Ser. No. 13/027,235, filed on Feb. 14, 2011 and titled DELIVERY SYSTEMS WITH IN-LINE SELECTIVE EXTRACTION DEVICES AND ASSOCIATED METHODS OF OPERATION; U.S. patent application Ser. No. 13/027,188, filed on Feb. 14, 2011 and titled METHODS, DEVICES, AND SYSTEMS FOR DETECTING PROPERTIES OF TARGET SAMPLES; U.S. patent application Ser. No. 13/027,068, filed on Feb. 14, 2011 and titled CARBON-BASED DURABLE GOODS AND RENEWABLE FUEL FROM BIOMASS WASTE DISSOCIATION; U.S. patent application Ser. No. 13/027,195, filed on Feb. 14, 2011 and titled OXYGENATED FUEL; U.S. patent application Ser. No. 13/027,196, filed on Feb. 14, 2011 and titled CARBON RECYCLING AND REINVESTMENT USING THERMOCHEMICAL REGENERATION; U.S. patent application Ser. No. 13/027,197, filed on Feb. 14, 2011 and titled MULTI-PURPOSE RENEWABLE FUEL FOR ISOLATING CONTAMINANTS AND STORING ENERGY; and U.S. patent application Ser. No. 13/027,185, filed on Feb. 14, 2011 and titled ENGINEERED FUEL STORAGE, RESPECIATION AND TRANSPORT.

I claim:

1. A process comprising:
    depositing boron nitride onto a substrate;
    applying heat through the substrate to form a plurality of layers comprising a matrix characterization of crystals of boron nitride, wherein the layers are formed through self-organization of the boron nitride into a crystalline structure of the matrix characterization;
    one or more layers from the plurality of layers to form an exfoliated layer, wherein the exfoliated layer is substantially parallel with any other exfoliated layer; and
    adding at least one precursor into the matrix characterization of crystals of boron nitride, thereby producing an architectural construct.

2. A process of claim 1, wherein the exfoliating the one or more layers comprises impregnating the plurality of layers with a fluid to create a pressure.

3. A process of claim 2, wherein the fluid comprises a gas including at least one of a paraffin and nitrogen.

4. A process of claim 1, wherein the architectural construct includes two or more exfoliated layers, further comprising adding at least one precursor between the exfoliated layers.

5. A process of claim 4, wherein the precursor comprises at least one of titanium, titanium hydride, iron, iron pentacarbonyl, nickel, cobalt, boron, nitrogen, carbon, hydrocarbon, silicon, and carbide gas.

6. A process of claim 1, wherein the adding at least one precursor into the matrix characterization of crystals of boron nitride further comprises applying at least one of heat or pressure.

7. A process of claim 1, further comprising stabilizing the exfoliated layers with a stabilizer.

8. A process of claim 7, wherein the stabilizer comprises at least one of a boron nitride fiber wrap and dopant atom.

9. A process of claim 1, wherein the adding the at least one precursor into the matrix characterization is at a selected location or region within the crystalline structure by applying energy at the particular frequency including using at least one of a laser, electron beam, or inductive or focused light.

10. A process of claim 1, wherein the precursor comprises at least one of titanium, titanium hydride, iron, iron pentacarbonyl, nickel, cobalt, boron, nitrogen, carbon, hydrocarbon, silicon, and carbide gas.

11. A process of claim 1, wherein the precursor includes a trace crystal modifier including at least one of neon, argon, or helium.

12. A process comprising:
    depositing boron nitride onto a substrate;
    applying heat through the substrate to form a plurality of layers comprising a matrix characterization of crystals of boron nitride, wherein the layers are formed through self-organization of the boron nitride into a crystalline structure of the matrix characterization;
    exfoliating one or more layers from the plurality of layers to form a first exfoliated layer and exfoliating another one or more layers from the plurality of layers to form a second exfoliated layer, wherein an exfoliated layer is substantially parallel with any other exfoliated layer; and
    adding at least one precursor at a selected location or region (i) within the crystalline structure of the matrix characterization, (ii) between the first and second exfoliated layers, or (iii) within the crystalline structure of the matrix characterization and between the first and second exfoliated layers, by applying energy at a particular frequency, thereby producing an architectural construct.

13. A process of claim 12, wherein the exfoliating the one or more layers comprises impregnating the self-organized plurality of layers with a fluid to create a pressure.

14. A process of claim 12, wherein the adding at least one precursor further comprises applying at least one of heat or pressure.

15. A process of claim 12, further comprising stabilizing the exfoliated layers with a stabilizer.

16. A process of claim 12, wherein the applying energy at the particular frequency includes using at least one of a laser, electron beam, or inductive or focused light.

* * * * *